(12) United States Patent
Ishiwata et al.

(10) Patent No.: US 6,452,204 B1
(45) Date of Patent: Sep. 17, 2002

(54) TUNNELING MAGNETORESISTANCE TRANSDUCER AND METHOD FOR MANUFACTURING THE SAME

(75) Inventors: Nobuyuki Ishiwata; Keishi Ohashi; Hisanao Tsuge, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/456,881

(22) Filed: Dec. 8, 1999

(30) Foreign Application Priority Data

Dec. 8, 1998 (JP) .......................................... 10-348212

(51) Int. Cl.⁷ .............................................. H01L 29/06
(52) U.S. Cl. ...................................... 257/9; 360/324.2
(58) Field of Search ........................... 257/9; 360/324.2

(56) References Cited

U.S. PATENT DOCUMENTS

| | | | | |
|---|---|---|---|---|
| 5,302,461 A | * | 4/1994 | Anthony ..................... | 428/472 |
| 5,835,314 A | * | 11/1998 | Moodera et al. ............ | 360/113 |
| 5,859,754 A | * | 1/1999 | Tong et al. ................. | 360/113 |
| 5,986,858 A | * | 11/1999 | Sato et al. .................. | 360/113 |
| 6,215,696 B1 | * | 4/2001 | Tsuge ......................... | 365/173 |
| 6,174,736 B1 | * | 1/2002 | Tsukamoto et al. ........... | 438/3 |

FOREIGN PATENT DOCUMENTS

| | | | |
|---|---|---|---|
| EP | 0 096 741 A1 | * | 2/1983 |
| JP | 5-63254 | | 3/1993 |
| JP | 6-244477 | | 9/1994 |
| JP | 8-70148 | | 3/1996 |
| JP | 8-70149 | | 3/1996 |
| JP | 8-221719 | | 8/1996 |
| JP | 10-93159 | | 4/1998 |
| JP | 10-208218 | * | 8/1998 |

OTHER PUBLICATIONS

Ching Tsang et al., "Design, Fabrication & Testing of Spin–Valve Read Heads for High Density Recording", pp. 3801–3806, IEEE Transactions on Magnetics, vol. 30, No. 6, Nov. 1994.

N. Ishiwata, et al., "Narrow Track MR Head Technology", pp. 38–42, IEEE Transactions on Magnetics, vol. 32, No. 1, Jan. 1996.

J.S. Moodera et al., "Ferromagnetic–insulator–ferromagnet–ic tunneling: Spin–dependent tunneling and large magneto–resistance in Trilayer Junctions (invited)", pp. 4724–4729, Journal Appl. Phys. vol. 79, No. 8, Apr. 15, 1996.

R.P. Hunt, "A Magnetoresistive Readout Transducer", pp. 150–154, IEEE Transactions on Magnetics, vol. Mag–7, No. 1, Mar. 1971.

F.W. Gorter et al., "Magnetoresistive Reading of Information", pp. 899–902, IEEE Transactions on Magnetics, vol. Mag–10, 1974.

R.D. Hempstead, "Analysis of Thermal Noise Spike Cancellation", pp. 1224–1226, IEEE Transactions on Magnetics, vol. Mag–11, No. 5, Sep. 1975.

N. Tezuka et al., "Relationship between the Barrier and Magnetoresistance Effect in Ferromagnetic Tunneling Junctions", pp. 493–496, Japan Applied Magnetics Proceedings, vol. 21, No. 4–2, 1997.

S. Kumagai et al., "Ferromagnetic Tunneling Magnetoresistive Effect for NiFe/CoAl$_2$O$_3$/Co/NiFe/FeMn Junctions", pp. 561–564, Japan Applied Magnetics Proceedings, vol. 22, No. 402, 1998.

* cited by examiner

Primary Examiner—Nathan Flynn
Assistant Examiner—Ahmed N. Sefer
(74) Attorney, Agent, or Firm—Young & Thompson

(57) ABSTRACT

In a tunneling magnetoresistance transducer including first and second ferromagnetic layers and a tunnel barrier layer made of insulating material sandwiched by the first and second ferromagnetic layers, the resistance of the tunnel barrier layer remains essentially constant independent of the temperature of the transducer.

27 Claims, 25 Drawing Sheets

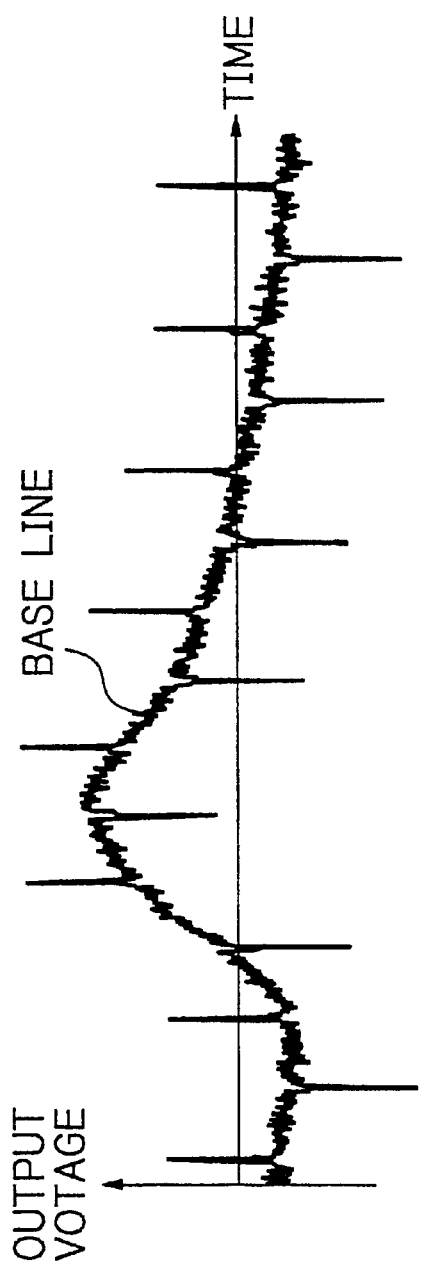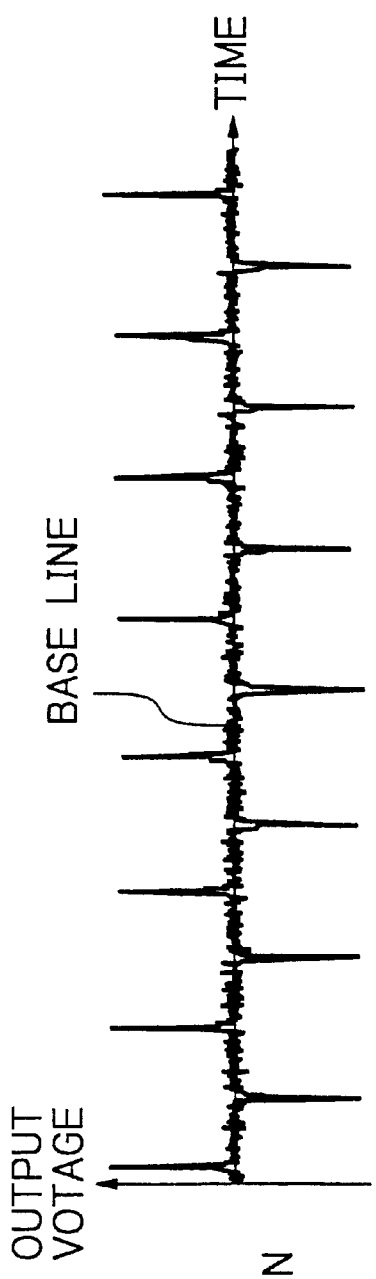
Fig. 9A PRIOR ART
Fig. 9B PRESENT INVENTION

Fig. 19A

NATURAL OXIDE

| STACKED STRUCTURE | MR RATIO (%) | RESISTANCE | TEMP. COEFFICIENT (%/°C) |
|---|---|---|---|
| NiFe/Al–O(3nm)/CoFe/PtMn | 11 | $5 \times 10^{-5}$ $\Omega cm^2$ | −0.015 |
| NiFe/Al–O(2nm)/CoFe/PtMn | 28 | $3 \times 10^{-6}$ $\Omega cm^2$ | −0.01 |
| NiFe/Al–O(1nm)/CoFe/PtMn | 33 | $8 \times 10^{-7}$ $\Omega cm^2$ | −0.007 |
| NiFe/Al–O(0.7nm)/CoFe/PtMn | 32 | $1 \times 10^{-7}$ $\Omega cm^2$ | −0.005 |
| NiFe/Al–O(0.5nm)/CoFe/PtMn | 18 | $3 \times 10^{-8}$ $\Omega cm^2$ | −0.008 |
| NiFe/Al–O(0.4nm)/CoFe/PtMn | 14 | $3 \times 10^{-9}$ $\Omega cm^2$ | −0.01 |
| NiFe/Al–O(0.3nm)/CoFe/PtMn | 11 | $1 \times 10^{-9}$ $\Omega cm^2$ | −0.01 |
| NiFe/Gd–O(1nm)/CoFe/PtMn | 25 | $8 \times 10^{-7}$ $\Omega cm^2$ | −0.033 |
| NiFe/Tb–O(1nm)/CoFe/PtMn | 20 | $5 \times 10^{-7}$ $\Omega cm^2$ | −0.035 |
| NiFe/Mg–O(1nm)/CoFe/PtMn | 20 | $9 \times 10^{-7}$ $\Omega cm^2$ | −0.025 |
| NiFe/Mg–O(0.7nm)/CoFe/PtMn | 24 | $5 \times 10^{-7}$ $\Omega cm^2$ | −0.023 |
| NiFe/Mg–O(0.5nm)/CoFe/PtMn | 18 | $8 \times 10^{-9}$ $\Omega cm^2$ | −0.021 |

Fig. 19B

NATURAL NITRIDE

| STACKED STRUCTURE | MR RATIO (%) | RESISTANCE | TEMP. COEFFICIENT (%/°C) |
|---|---|---|---|
| NiFe/Al-N(3nm)/CoFe/PtMn | 6 | $2 \times 10^{-5}$ $\Omega cm^2$ | -0.025 |
| NiFe/Al-N(2nm)/CoFe/PtMn | 15 | $1 \times 10^{-6}$ $\Omega cm^2$ | -0.023 |
| NiFe/Al-N(1nm)/CoFe/PtMn | 23 | $3 \times 10^{-7}$ $\Omega cm^2$ | -0.02 |
| NiFe/Al-N(0.7nm)/CoFe/PtMn | 25 | $5 \times 10^{-8}$ $\Omega cm^2$ | -0.018 |
| NiFe/Al-N(0.5nm)/CoFe/PtMn | 13 | $1 \times 10^{-9}$ $\Omega cm^2$ | -0.018 |
| NiFe/Sm-O(0.1nm)/CoFe/PtMn | 22 | $6 \times 10^{-7}$ $\Omega cm^2$ | -0.039 |

Fig. 19C

UV-ASSISTED NATURAL OXIDE

| STACKED STRUCTURE | MR RATIO (%) | RESISTANCE | TEMP. COEFFICIENT (%/°C) |
|---|---|---|---|
| NiFe/Al-O(2nm)/CoFe/PtMn | 29 | $5 \times 10^{-6}$ $\Omega cm^2$ | -0.015 |
| NiFe/Al-O(1nm)/CoFe/PtMn | 35 | $9 \times 10^{-7}$ $\Omega cm^2$ | -0.011 |
| NiFe/Al-O(0.7nm)/CoFe/PtMn | 30 | $2 \times 10^{-7}$ $\Omega cm^2$ | -0.009 |

Fig. 19D

X-RAYS ASSISTED NATURAL OXIDE

| STACKED STRUCTURE | MR RATIO (%) | RESISTANCE | TEMP. COEFFICIENT (%/°C) |
|---|---|---|---|
| NiFe/Al-O(1nm)/CoFe/PtMn | 34 | $1 \times 10^{-8}$ $\Omega cm^2$ | -0.013 |
| NiFe/Al-O(0.7nm)/CoFe/PtMn | 34 | $1 \times 10^{-7}$ $\Omega cm^2$ | -0.01 |

Fig. 19E
PRIOR ART

| STACKED STRUCTURE | MR RATIO (%) | RESISTANCE | TEMP. COEFFICIENT (%/°C) |
|---|---|---|---|
| TMR1 { NiFe/Al-O(1nm)/CoFe/PtMn | 20 | $8 \times 10^{-4}$ $\Omega cm^2$ | −0.042 |
| NiFe/Al-O(0.7nm)/CoFe/PtMn | 24 | $5 \times 10^{-4}$ $\Omega cm^2$ | −0.041 |
| TMR2 { NiFe/Al-O(1nm)/CoFe/PtMn | 20 | $2 \times 10^{-2}$ $\Omega cm^2$ | −0.05 |
| NiFe/Al-O(0.7nm)/CoFe/PtMn | 10 | $1 \times 10^{-2}$ $\Omega cm^2$ | −0.058 |
| GMR NiFe/Cu/CoFe/PtMn | 6 | 20 Ω□ | −0.27 |
| AMR NiFe | 2 | 22 Ω□ | −0.15 |

□ REPRESENTS AN ASPECT RATIO OF 1.

TUNNELING MAGNETORESISTANCE TRANSDUCER AND METHOD FOR MANUFACTURING THE SAME

BACKGROUND OF THE INVENTION

1. Field of the Invention

The present invention relates to a tunneling magnetoresistance (TMR) transducer and a method for manufacturing the TMR transducer.

2. Description of the Related Art

As magnetic storage apparatuses have been developed in size and capacity, highly sensitive magnetoresistive (MR) sensors (heads) have been put in practical use (see: Robert P. Hunt, "A Magnetoresistive Readout Transducer", IEEE Trans. on Magnetics, Vol. MAG-7, No. 1, pp.150–154, March 1971). Since use is made of the anisotropy magnetoresistance effect of NiFe alloy, these MR heads are called AMR heads.

Recently, more highly sensitive giant magnetoresistance (GMR) sensors (heads) have also been developed in order to achieve higher areal recording density (see: Ching Tsang et al., "Design, Fabrication & Testing of Spin-Valve Read Heads for High Density Recording", IEEE Trans. on Magnetics, Vol. 30, No. 6, pp. 3801–3806, November 1994). A typical GMR head is constructed by a free ferromagnetic layer, a pinned ferromagnetic layer and a non-magnetic conductive layer sandwiched by the free ferromagnetic layer and the pinned ferromagnetic layer. In the GMR head, the resultant response is given by a cosine of an angle between the magnetization directions of the free ferromagnetic layer and the pinned ferromagnetic layer.

The GMR head as well as the MR head also serves as a temperature sensor. In other words, the resistance of the head is susceptible to the temperature thereof. Therefore, if the GMR head is applied to a read head of a magnetic storage apparatus for a hard magnetic disk, the GMR head is in contact with the hard magnetic disk, thereby greatly increasing the temperature of the GMR head, which can cause a problem known as a thermal asperity problem.

Thermal asperity per se is discussed in F. W. Gorter et al., "Magnetoresistive Reading of Information", IEEE Trans. on Magnetics, Vol. MAG-10, pp. 899–902, 1974 and R. D. Heristead, "Analysis of Thermal Noise Spike Cancellation", IEEE Trans. on Magnetics, Vol, MAG-11, No. 5, pp. 1224–1226, September 1975.

In particular, if the gap between the GMR head and a magnetic medium becomes less than about 40 nm, the thermal asperity problem becomes serious. In order to avoid the thermal asperity problem, the surface of a magnetic medium needs to be specially smoothed or a complex compensation circuit is required, which increases the manufacturing cost.

On the other hand, if the GMR head is applied to a magnetic tape apparatus for a soft magnetic disk or a floppy disk, the GMR head is often in contact with the floppy disk even if an air bearing is introduced. Therefore, it is impossible to apply the GMR head as well as the MR head to such a magnetic tape apparatus.

Additionally, use of a tunneling magnetoresistance (TMR) transducer as a read head has been investigated. A typical TMR transducer is constructed by a free feromagnetic layer, a pinned ferromagnetic layer and a tunnel barrier layer made of non-magnetic insulating material sandwiched by the free ferromagnetic layer and the pinned ferromagnetic layer.

In a first prior art TMR transducer, alumina is grown on an aluminum layer by an oxygen glow discharging process to obtain a tunnel barrier layer having a high TMR ratio of 18 percent (see: Jagadeesh S. Moodera et al., "Ferromagnetic-insulator-ferromagnetic tunneling: Spin-dependent tunneling and large magnetoresistance in trilayer junctions", Journal of Applied Physics, Vol. 79(8), pp. 4724–4729, April 1996). In more detail, a ferromagnetic layer made of CoFe is deposited on a glass substrate by a vacuum evaporation process, and then, an about 1.2 to 2.0 nm thick Al layer is deposited on the ferromagnetic layer also by a vacuum evaporation process. Next, the surface of the Al layer is exposed to oxygen and oxygen glow discharging process to obtain an alumina layer as the tunnel barrier layer.

In the first prior art TMR transducer, however, the oxygen glow discharging process produces oxygen ions and active oxygen such as radical oxygen, which makes the control of the thickness of the tunnel barrier layer difficult. Also, the tunnel barrier layer is contaminated by such oxygen, therefore degrading the quality of the TMR tranducer.

A second prior art TMR transducer has suggested that an Al layer be exposed to atmospheric air so as to form an alumina layer as a tunnel barrier layer (see: JP-A-63254, JP-A-6-244477, JP-A-8-70148, JP-A-8-70149, JP-A-8-316548 & N. Tezuka et al., "Relationship between the Barrier and Magnetoresistance Effect in Ferromagnetic Tunneling Junctions", Japan Applied Magnetics Proceeding, Vol, 21, No. 4-2, pp. 493–496, 1997).

In the second prior art TMR transducer, however, pin holes may be generated in the tunnel barrier layer by particles in the air, and the tunnel barrier layer is also contaminated by water, carbon oxide and nitrogen oxide in the air, thereby degrading the quality of the TMR transducer.

A third prior art transducer has suggested a TMR transducer which is not dependent upon the temperature (see: S. Kumagai et al., "Ferromagnetic Tunneling Magnetoresistance Effect for NiFe/Co/$Al_2O_3$/Co/NiFe/FeNn Junctions", Japan Applied Magnetics Proceedings, Vol. 22, No. 4-2, pp. 561–564, 1998).

In the third prior art TMR transducer, the TMR ratio and saturated resistance are not dependent upon the annealing temperature; however, there is no discussion on the dependence of the TMR ratio on the temperature of the TMR transducer which in practical use. Additionally, the resistance of the third prior art TMR transducer is so high that it is impossible to apply this TMR transducer to a read head of a magnetic storage apparatus.

A fourth prior art TMR transducer has suggested an inert metal layer as a tunnel barrier layer in order to suppress the occurrence of pin holes therein, thus obtaining a high TMR ratio (see JP-A-10-208218).

A fifth prior art TMR transducer has suggested that a lower ferromagnetic layer be directly connected to a substrate so as to suppress the occurrence of pin holes in a tunnel barrier layer, thus obtaining a high TMR ratio (see JP-A-10-93159.

The fourth and fifth prior art TMR transducers, however, do not discuss the temperature dependence of the TMR transducer.

SUMMARY OF THE INVENTION

It is an object of the present invention to provide a TMR transducer capable of suppressing the thermal asperity problem.

Another object is to provide a method for manufacturing such a TMR transducer.

According to the present invention, in a tunneling magnetoresistance transducer including first and second ferromagnetic layers and a tunnel barrier layer made of insulating material sandwiched by the first and second ferromagnetic layers, the resistance of the tunnel barrier layer remains essentially constant independent of the temperature of the transducer.

BRIEF DESCRIPTION OF THE DRAWINGS

The present invention will be more clearly understood from the description set forth below, with reference to the accompanying drawings: wherein:

FIG. 9A is a timing diagram of the output voltage of the prior art spin value type transducer;

FIG. 9B is a timing diagram of the output voltage of the TMR transducer according to the present invention;

FIGS. 19A, 19B, 19C and 19D are tables showing the characteristics of the TMR transducers according to the present invention; and FIG. 19E is a table showing the characteristics of the prior art TMR transducers, the prior art GMR transducer and the prior art AMR transducer.

DESCRIPTION OF THE PREFERRED EMBODIMENTS

A first embodiment of the method for manufacturing a TMR transducer will be explained with reference to FIGS. 1A through 1C.

Figure 1A:
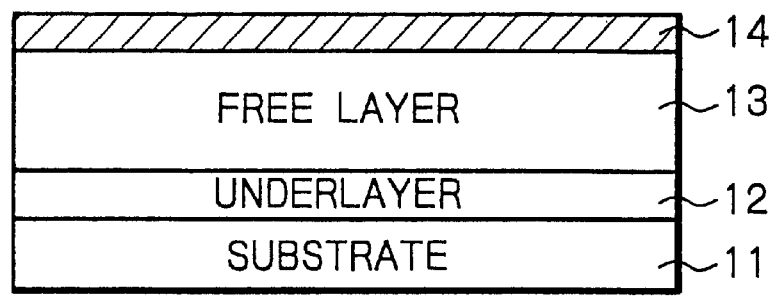
FIGS. 1A through 1C are cross sectional, air bearing surface (ABS) views for explaining a first embodiment of the method for manufacturing a TMR transducer according to the present invention.

First, referring to FIG. 1A, an underlayer 12 made of Ta or the like, a free layer 13 made of ferromagnetic material such as Fe, Co, Ni or their alloy and a conductive layer 14 made of Al, Mg or lanthanoid metal are sequentially deposited on a substrate (wafer) 11 made of $Al_2O_3.TiC$ or the like in a vacuum chamber. Note that the underlayer 12 serves as an interface layer between the substrate 11 and the free layer 13, so as to improve the crystal structure of the free layer 13.

Figure 1B:
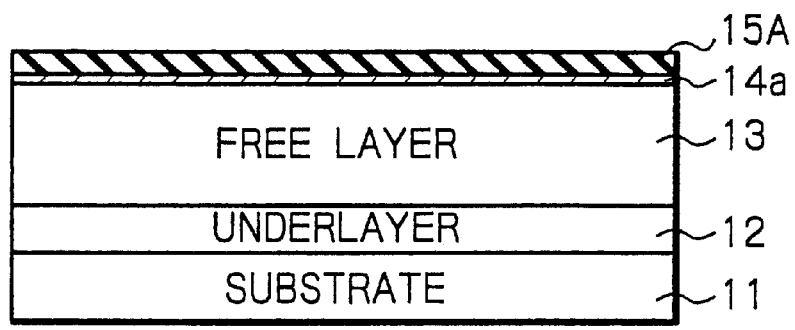

Next, referring to FIG. 1B, pure oxygen is introduced into the vacuum chamber without exposing the wafer to air. As a result, the conductive layer 14 is naturally oxidized to grow a tunnel barrier layer 15A made of oxide thereon. In this case, the conductive layer 14 remains as a conductive layer 14a. Thus, oxygen is exhausted from the chamber.

Figure 1C:
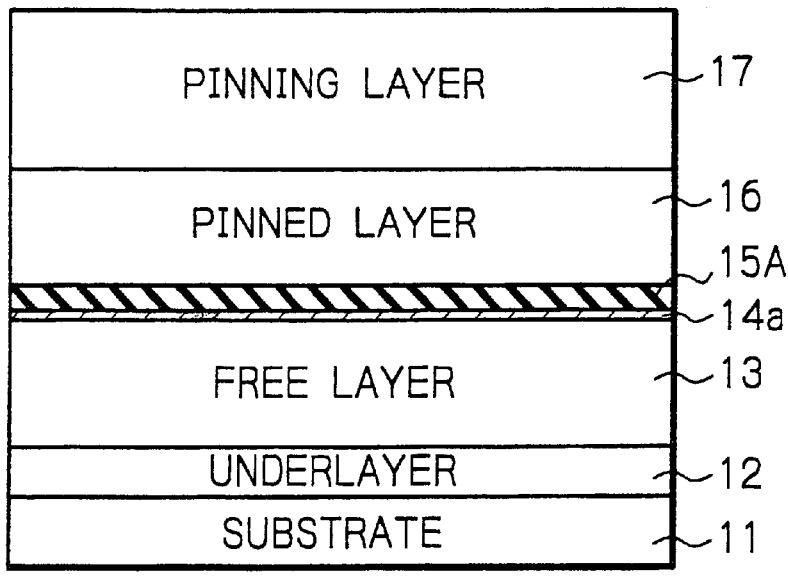

Finally, referring to FIG. 1C, a pinned layer 16 made of ferromagnetic material such as Fe, Co, Ni or their alloy and a pinning layer 17 made of antiferromagnetic material such as FeMn are sequentially deposited on the tunnel barrier layer 15A, thus completing a TMR structure. The pinning layer 17 provides an anisotropic exchange coupling with the pinned layer 16, so that the direction of magnetization of the pinned layer 16 is pinned with its easy axis perpendicular to the air bearing surface (ABS).

In the first embodiment as illustrated in FIGS. 1A, 1B and 1C, since the tunnel barrier layer 15A is grown in a thermal equilibrium state without impurities, the tunnel barrier layer 15A has high quality and controllability. Therefore, the low resistance and the large current density of the tunnel barrier layer 15A can be realized by adjusting the pressure of oxygen and the substrate temperature. Also, the characteristics of TMR transducers can be homogenized within one wafer, and excellent reproducibility of TMR transducers can be obtained among wafer lots.

Additionally, since the free layer 13 is made of Fe, Co, Ni or their alloy, Al, Mg or lanthanoid metal has lower free energy than the free layer 13, the conductive layer 14(14a) made of Al, Mg or lanthanoid metal has good coverage characteristics over the free layer 13. Therefore, no pin hole is created in the tunnel barrier layer 15A, which would prevent the free layer 13 and the pinned layer 16 from being short-circuited through the tunnel barrier layer 15A.

Further, since the production free energy of Al oxide (alumina), Mg oxide or lanthanoid metal oxide per one oxygen atom is greater than the production free energy of Fe oxide, Co oxide or Ni oxide per one oxygen atom, the tunnel barrier layer 15A is thermally stable.

A second embodiment of the method for manufacturing a TMR transducer will be explained with reference to FIGS. 2A through 2C.

Figure 2A:
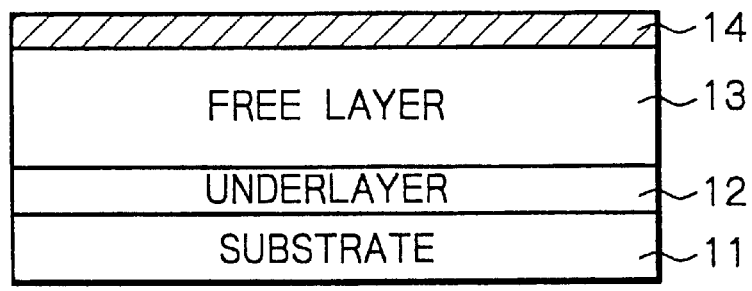
FIGS. 2A through 2C are cross-sectional, ABS views for explaining a second embodiment of the method for manufacturing a TMR transducer according to the present invention.

First, referring to FIG. 2A, in the same way as in FIG. 1A, an underlayer 12 made of Ta or the like, a free layer 13 made of ferromagnetic material such as Fe, Co, Ni or their alloy and a conductive layer 14 made of Al, Mg or lanthanoid metal are sequentially deposited on a substrate (wafer) 11 made of $Al_2O_3$.TiC or the like in a vacuum chamber. Note that the underlayer 12 serves as an interface layer between the substrate 11 and the free layer 13, so as to improve the crystal substrate of the free layer 13.

Figure 2B:
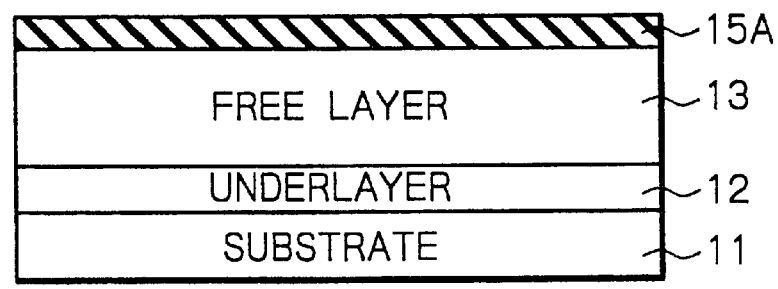

Next, referring to FIG. 2B, pure oxygen is introduced into the vacuum chamber without exposing the wafer to air. As a result, the conductive layer 14 is naturally oxidized to grow a tunnel barrier layer 15A made of oxide thereon. In this case, the conductive layer 14 is completely changed into the tunnel barrier layer 15A. Then, oxygen is exhausted from the chamber.

Figure 2C:
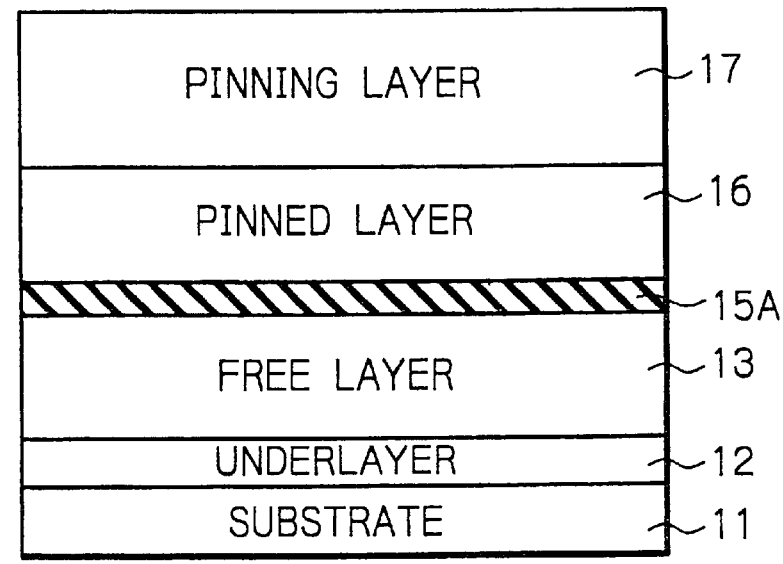

Finally, referring to FIG. 2C, in the same way as in FIG. 1C, a pinned layer 16 made of ferromagnetic material such as Fe, Co, Ni or their alloy and a pinning layer 17 made of antiferromagnetic material such as FeMn are sequentially deposited on the tunnel barrier layer 15A, thus completing a TMR structure. The pinning layer 17 provides an anisotropic exchange coupling with the pinned layer 16, so that the direction of magnetization of the pinned layer 16 is pinned with its easy axis perpendicular to the air bearing surface (ABS).

Even in the second embodiment as illustrated in FIGS. 2A, 2B and 2C, since the tunnel barrier layer 15A is grown in a thermal equilibrium state without impurities, the tunnel barrier layer 15A has high quality and controllability. Therefore, the low resistance and the large current density of the tunnel barrier layer 15A can be realized by adjusting the pressure of oxygen and the substrate temperature. Also, the characteristics of TMR transducers can be homogenized within one wafer, and excellent reproducibility of TMR transducers can be obtained among wafer lots.

Additionally, since the free layer 13 is made of Fe, Co, Ni or their alloy, Al, Mg or lanthanoid metal has lower free energy than the free layer 13, the conductive layer 14 made of Al, Mg or lanthanoid metal has good coverage characteristics over the free layer 13. Therefore, no pin hole is created in the tunnel barrier layer 15A, which would prevent the free layer 13 and the pinned layer 16 from being short-circuited through the tunnel barrier layer 15A.

Further, since the production free energy of Al oxide (alumina) Mg oxide or lanthanoid metal oxide per one oxygen atom is greater than the production free energy of Fe oxide, Co oxide or Ni oxide per one oxygen atom, the tunnel barrier layer 15A is thermally stable.

A third embodiment of the method for manufacturing a TMR transducer will be explained with reference to FIGS. 3A through 3C.

Figure 3A:
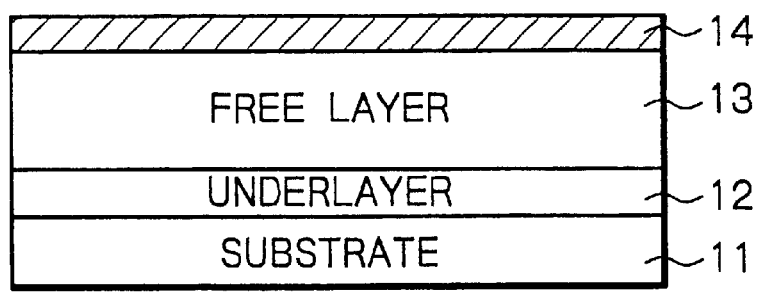
FIGS. 3A through 3C are cross-sectional, ABS views for explaining a third embodiment of the method for manufacturing a TMR transducer according to the present invention.

First, referring to FIG. 3A, in the same way as in FIG. 1A, an underlayer 12 made of Ta or the like, a free layer 13 made of ferromagnetic material such as Fe, Co, Ni or their alloy and a conductive layer 14 made of Al, Mg or lanthanoid metal are sequentially deposited on a substrate (wafer) 11 made of $Al_2O_3$.TiC or the like in a vacuum chamber. Note that the underlayer 12 serves as an interface layer between the substrate 11 and the free layer 13, so as to improve the crystal structure of the free layer 13.

Figure 3B:
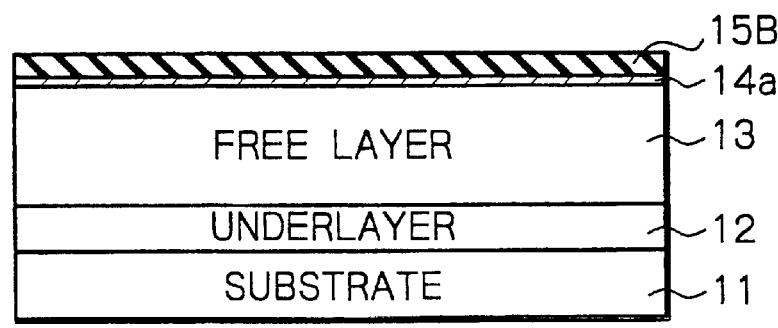

Next, referring to FIG. 3B, pure nitrogen is introduced into the vacuum chamber without exposing the wafer to air. As a result, the conductive layer 14 is naturally nitrided to grow a tunnel barrier layer 15B made of nitride thereon. In this case, the conductive layer 14 remains as a conductive layer 14a. Then, nitrogen is exhausted from the chamber.

Figure 3C:
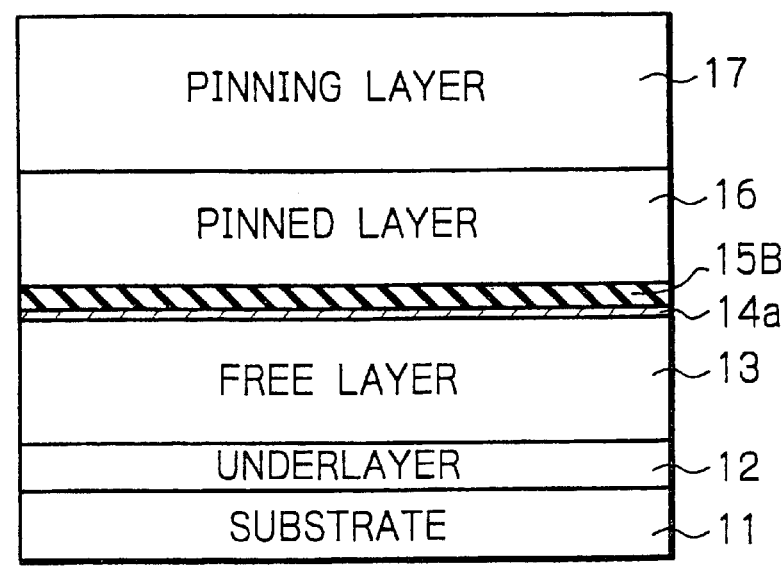

Finally, referring to FIG. 3C, in the same way as in FIG. 1C, a pinned layer 16 made of ferromagnetic material such as Fe, Co, Ni or their alloy and a pinning layer 17 made of antiferromagnetic material such as FeMn are sequentially deposited on the tunnel barrier layer 15B, thus completing a TMR structure. The pinning layer 17 provides an anisotropic exchange coupling with the pinned layer 16, so that the direction of magnetization of the pinned layer 16 is pinned with its easy axis perpendicular to the air bearing surface (ABS).

Even in the third embodiment as illustrated in FIGS. 3A, 3B and 3C, since the tunnel barrier layer 15B is grown in a thermal equilibrium state with impurities, the tunnel barrier layer 15A has high quality and controllability. Therefore, the low resistance and the large current density of the tunnel barrier layer 15B can be realized by adjusting the pressure of nitrogen and the substrate temperature. Also, the characteristics of TMR transducers can be homogenized within one wafer, and excellent reproducibility of TMR transducers can be obtained among wafer lots.

Additionally, since the free layer 13 is made of Fe, Co, Ni or their alloy, Al, Mg or lanthanoid metal has lower free energy than the free layer 13, the conductive layer 14(14a) made of Al, Mg or lanthanoid metal has good coverage characteristics over the free layer 13. Therefore, no pin hole is created in the tunnel barrier layer 15B, which would prevent the free layer 13 and the pinned layer 16 from being short-circuited through the tunnel barrier layer 15B.

Further, since the production free energy of Al nitride Mg nitride or lanthanoid metal nitride per one nitrogen atom is greater than the production free energy of Fe nitride, Co nitride or Ni nitride per one nitrogen atom, the tunnel barrier layer 15B is thermally stable.

A fourthe embodiment of the method for manufacturing a TMR transducer will be explained with reference to FIGS. 4A through 4C.

Figure 4A:
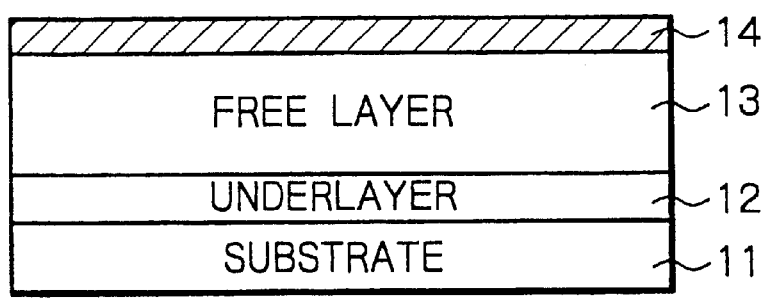
FIGS. 4A through 4C are cross-sectional, ABS views for explaining a fourth embodiment of the method for manufacturing a TMR transducer according to the present invention.

First, referring to FIG. 4A, in the same way as in FIG. 1A, an under layer 12 made of Ta or the like, a free layer 13 made of ferromagnetic material such as Fe, Co, Ni or their alloy and a conductive layer 14 made of Al, Mg or lanthanoid metal are sequentially deposited on a substrate (wafer) 11 made of $Al_2O_3$.TiC or the like in a vacuum chamber. Note that the underlayer 12 serves as an interface layer between the substrate 11 and the free layer 13, so as to improve the crystal structure of the free layer 13.

Figure 4B:
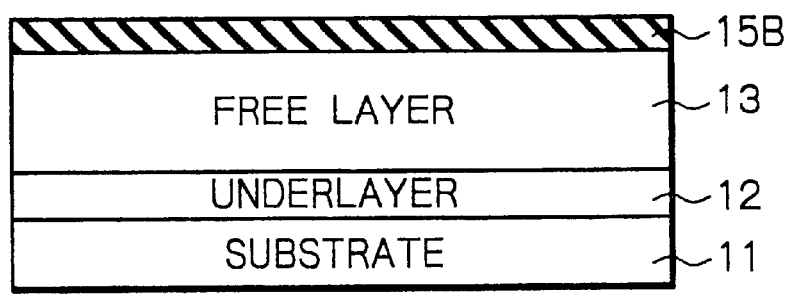

Next, referring to FIG. 4B, pure nitrogen is introduced into the vacuum chamber without exposing the wafer to air. As a result, the conductive layer 14 is naturally nitrided to grow a tunnel barrier layer 15B made of nitride thereon. In this case, the conductive layer 14 is completely changed into the tunnel barrier layer 15B. Then, nitrogen is exhausted from the chamber.

Figure 4C:
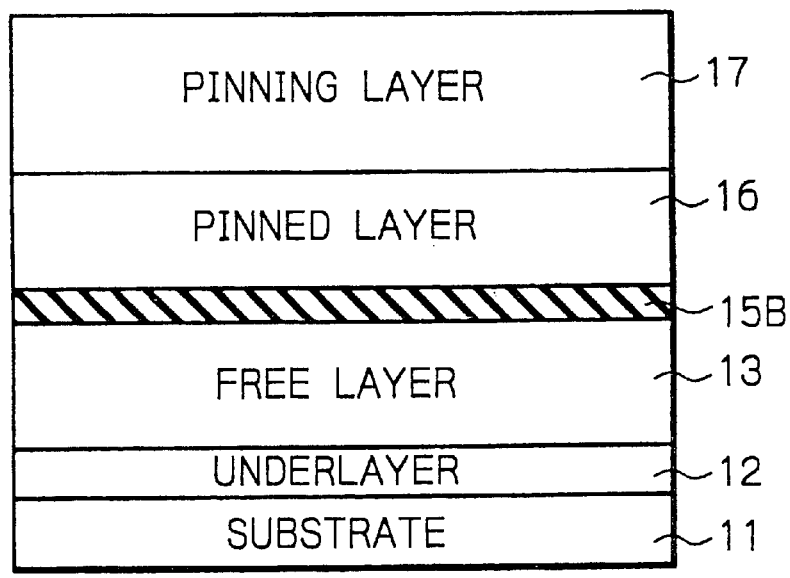

Finally, referring to FIG. 4C, in the same way as in FIG. 1C, a pinned layer 16 made of ferromagnetic material such as Fe, Co, Ni or their alloy and a pinning layer 17 made of antiferromagnetic material such as FeMn are sequentially deposited on the tunnel barrier layer 15B, thus completing a TMR structure. The pinning layer 17 provides an anisotropic exchange coupling with the pinned layer 16, so that the direction of magnetization of the pinned layer 16 is pinned with its easy axis perpendicular to the air bearing surface (ABS).

Even in the fourth embodiment as illustrated in FIGS. 4A, 4B and 4C, since the tunnel barrier layer 15B is grown in a thermal equilibrium state without impurities, the tunnel barrier layer 15B has high quality and controllability. Therefore, the low resistance and the large current density of the tunnel barrier layer 15B can be realized by adjusting the pressure of nitrogen and the substrate temperature. Also, the characteristics of TMR transducers can be homogenized within one wafer, and excellent reproducibility of TMR transducers can be obtained among wafer lots.

Additionally, since the free layer 13 is made of Fe, Co, Ni or their alloy, Al, Mg or lanthanoid metal has lower free energy than the free layer 13, the conductive layer 14 made of Al, Mg or lanthanoid metal has good coverage characteristics over the free layer 13. Therefore, no pin hole is created in the tunnel barrier layer 15B, which would prevent the free layer 13 and the pinned layer 16 from being short-circuited through the tunnel barrier layer 15B.

Further, since the production free energy of Al nitride Mg nitride or lanthanoid metal nitride per one oxygen atom is greater than the production free energy of Fe nitride, Co nitride or Ni nitride per one nitride atom, the tunnel barrier layer 15B is thermally stable.

A fifth embodiment of the method for manufacturing a TMR transducer will be explained with reference to FIGS. 5A through 5E.

Figure 5A:
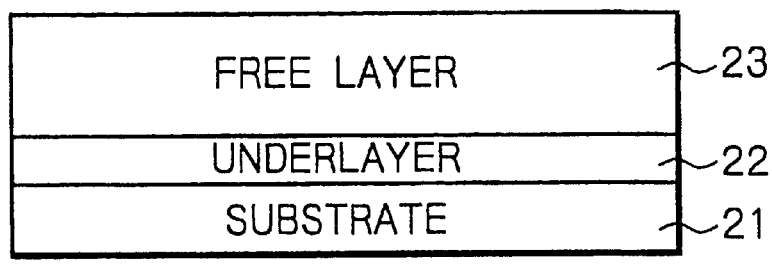
FIGS. 5A through 5E are cross-sectional, ABS views for explaining a fifth embodiment of the method for manufacturing a TMR transducer according to the present invention.

First, referring to FIG. 5A, an underlayer 22 made of Ta or the like and a free layer 23 made of ferromagnetic material such as Fe, Co, Ni or their alloy are sequentially deposited on a substrate (wafer) 21 made of $Al_2O_3$.TiC or the like in a vacuum chamber. Note that the underlayer 22 serves as an interface layer between the substrate 11 and the free layer 23, so as to improve the crystal structure of the free layer 23.

Figure 5B:
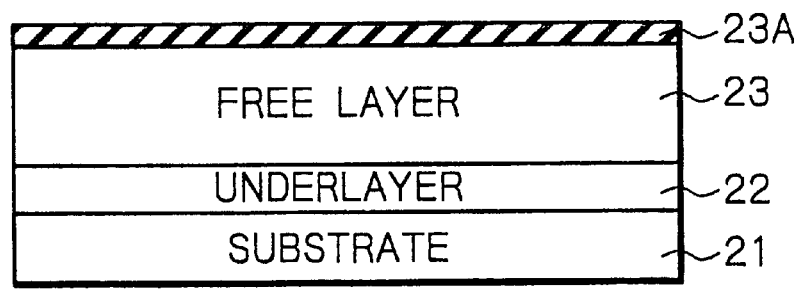

Next, referring to FIG. 5B, pure oxygen is introduced into the vacuum chamber without exposing the wafer to air. As a result, the free layer 23 is naturally oxidized to grow an oxide layer 23A thereon. Then, oxygen is exhausted from the chamber.

Figure 5C:
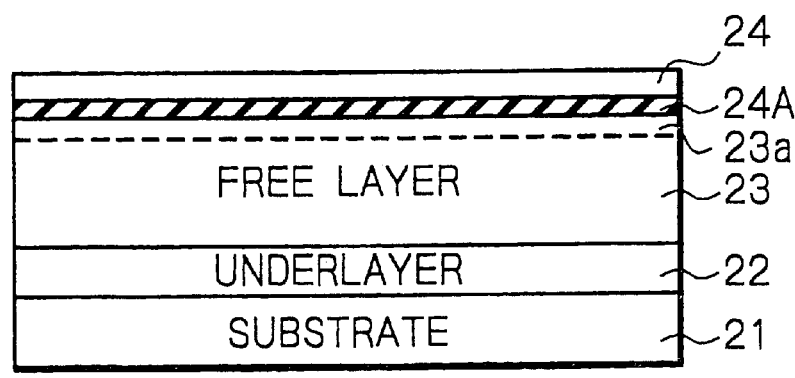
Figure 5D:
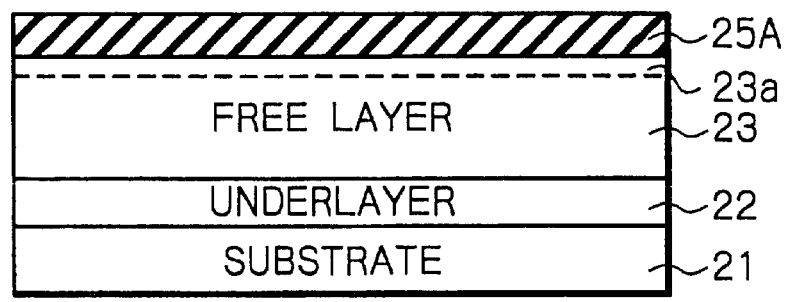

Next, referring to FIG. 5C, a conductive layer 24 made of Al, Mg or lanthanoid metal is deposited on the oxide layer 23A. In this case, oxygen is diffused from the oxide layer 23A to the conductive layer 24, so that a part of the conductive layer 24 is oxidised to grow an oxide layer 24A beneath the conductive layer 24. On the other hand, the oxide layer 23A of the free layer 23 is reduced so as to again become a part of the free layer 23.

Next, referring to FIG. 5D, pure oxygen is again introduced into the vacuum chamber without exposing the wafer to air. As a result, the conductive layer 24 is naturally oxidized to grow a tunnel barrier layer 25A made of oxide thereon. In this case, the conductive layer 24 is completely changed into the tunnel barrier layer 25A, so that the tunnel barrier layer 25A includes the oxide layer 24A.

Figure 5E:
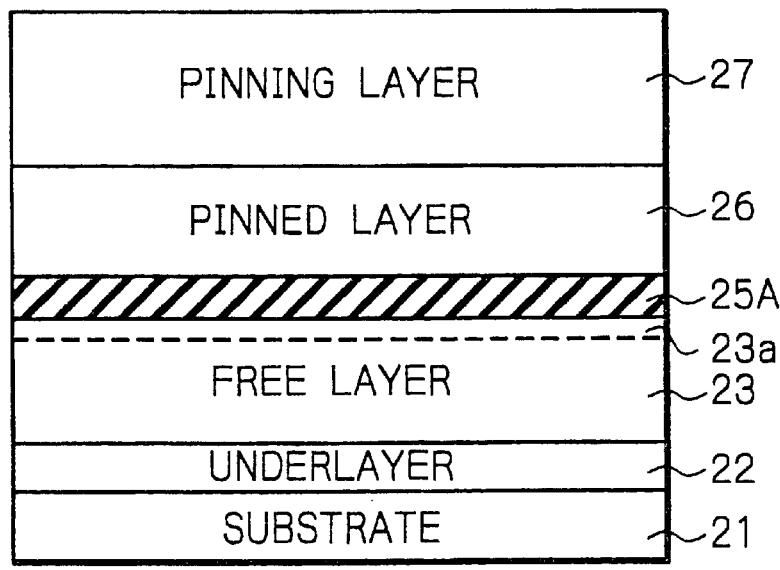

Finally, referring to FIG. 5E, in the same way as in FIG. 1C, a pinned layer 26 made of ferromagnetic material such as Fe, Co, Ni or their alloy and a pinning layer 27 made of antiferromagnetic material such as FeMn are sequentially deposited on the tunnel barrier layer 25A, thus completing a TMR structure. The pinning layer 27 provides an anisotropic exchange coupling with the pinned layer 26, so that the direction of magnetization of the pinned layer 26 is pinned with its easy axis perpendicular to the air bearing surface (ABS).

In the fifth embodiment as illustrated in FIGS. 5A through 5E, since the tunnel barrier layer 25A is grown in a thermal equilibrium state without impurities, the tunnel barrier layer 25A has high quality and controllability. Therefore, the low resistance and the large current density of the tunnel barrier layer 25A can be realized by adjusting the pressure of oxygen and the substrate temperature. Also, the characterization of TMR transducers can be homogenized within one wafer, and excellent reproducibility of TMR transducers can be obtained among wafer lots.

Additionally, since the free layer 23 is made of Fe, Co, Ni or their alloy, Al, Mg or lanthanoid metal has lower free energy than the free layer 23, the conductive layer 24 made of Al, Mg or lanthanoid metal has good coverage characteristics over the free layer 23. Therefore, no pin hole is created in the tunnel barrier layer 25A, which would prevent the free layer 23 and the pinned layer 26 from being short-circuited through the tunnel barrier layer 25A.

Further, since the production free energy of Al oxide (alumina) Mg oxide or lanthanoid metal oxide per one oxygen atom is greater than the production free energy of Fe oxide, Co oxide or Ni oxide per one oxygen atom, the tunnel barrier layer 25A is thermally stable.

A sixth embodiment of the method for manufacturing a TMR transducer will be explained with reference to FIGS. 6A through 6E.

Figure 6A:
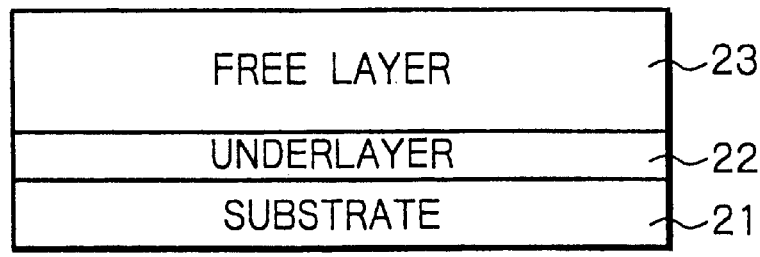
FIGS. 6A through 6E are cross-sectional, ABS views for explaining a sixth embodiment of the method for manufacturing a TMR transducer according to the present invention.

First, referring to FIG. 6A, in the same way as in FIG. 5A, an underlayer 22 made of Ta or the like and a free layer 23 made of ferromagnetic material such as Fe, Co, Ni or their alloy are sequentially deposited on a substrate (wafer) 21 made of $Al_2O_3$.TiC or the like in a vacuum chamber. Note that the underlayer 22 serves as an interface layer between the substrate 11 and the free layer 23, so as to improve the crystal structure of the free layer 23.

Figure 6B:
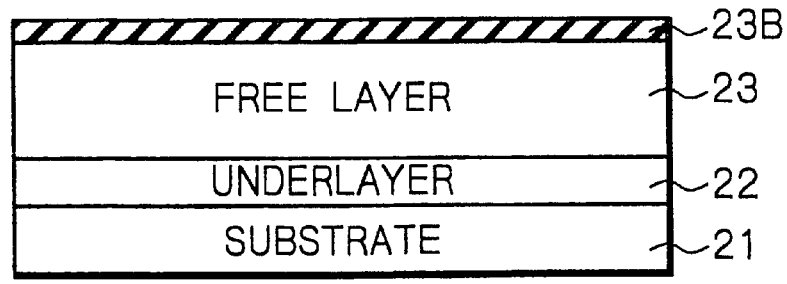

Next, referring to FIG. 6B, pure nitrogen is introduced into the vacuum chamber without exposing the wafer to air. As a result, the free layer 23 is naturally nitrided to grow a nitride layer 23B thereon. Then, nitrogen is exhausted from the chamber.

Figure 6C:
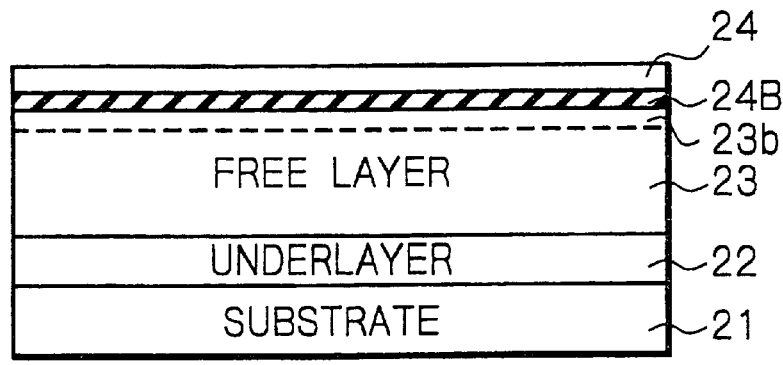
Figure 6D:
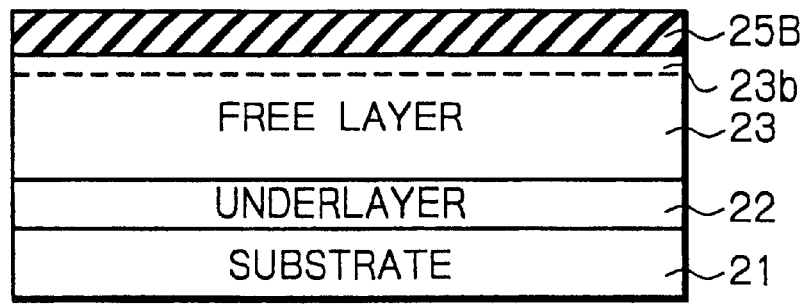

Next, referring to FIG. 6C, a conductive layer 24 made of Al, Mg or lanthanoid metal is deposited on the nitride layer 23B. In this case, nitrogen is diffused from the nitride layer 23B to the conductive layer 24, so that a part of the conductive layer 24 is nitrided to grow a nitride layer 24B beneath the conductive layer 24. On the other hand, the nitride layer 23B of the free layer 23 is reduced so as to again become a part of the free layer 23.

Next, referring to FIG. 6D, pure nitrogen is again introduced into the vacuum chamber without exposing the wafer to air. As a result, the conductive layer 24 is naturally nitrided to grow a tunnel barrier layer 25B made of nitride thereon. In this case, the conductive layer 24 is completely changed into the tunnel barrier layer 25B, so that the tunnel barrier layer 25B includes the nitride layer 24B.

Figure 6E:
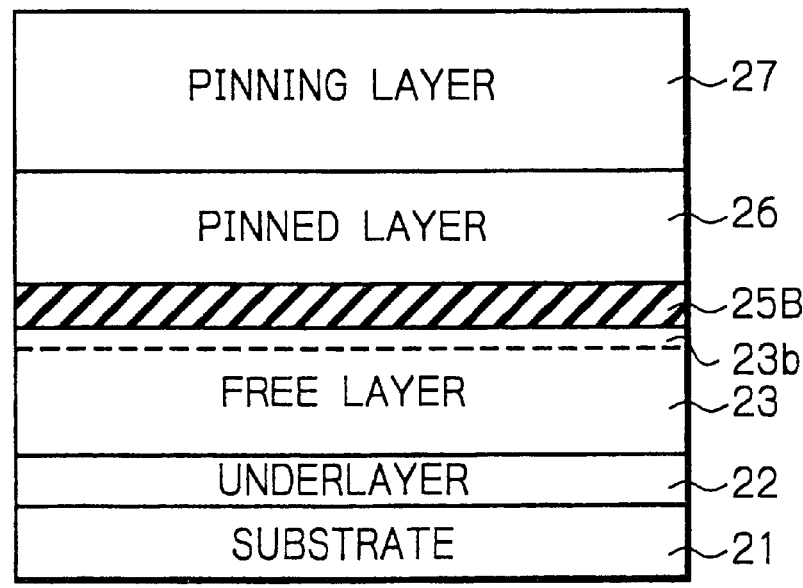

Finally, referring to FIG. 6E, in the same way as in FIG. 1C, a pinned layer 26 made of ferromagnetic material such as Fe, Co, Ni or their alloy and a pinning layer 27 made of antiferromagnetic material such as FeMn are sequentially deposited on the tunnel barrier layer 25B, thus completing a TMR structure. The pinning layer 27 provides an anisotropic exchange coupling with the pinned layer 26, so that the direction of magnetization of the pinned layer 26 is pinned with its easy axis perpendicular to the air bearing surface (ABS).

Even in the sixth embodiment as illustrated in FIGS. 6A, through 6E, since the tunnel barrier layer 25B is grown in a thermal equilibrium state without impurities, the tunnel barrier layer 25B has high quality and controllability. Therefore, the low resistance and the large current density of the tunnel barrier layer 25B can be realized by adjusting the pressure of nitrogen and the substrate temperature. Also, the characteristics of TMR transducers can be homogenized within one wafer, and excellent reproducibility of TMR transducers can be obtained among wafer lots.

Additionally, since the free layer 23 is made of Fe, Co, Ni or their alloy, Al, Mg or lanthanoid metal has lower free energy than the free layer 23, the conductive layer 24 made of Al, Mg or lanthanoid metal has good coverage characteristics over the free layer 23. Therefore, no pin hole is created in the tunnel barrier layer 25B, which would prevent the free layer 23 and the pinned layer 26 from being short-circuited through the tunnel barrier layer 25B.

Further, since the production free energy of Al nitride Mg nitride or lanthanoid metal nitride per one nitrogen atom is greater than the production free energy of Fe nitride, Co nitride or Ni nitride per one nitrogen atom, the tunnel barrier layer 25B is thermally stable.

Figure 7:
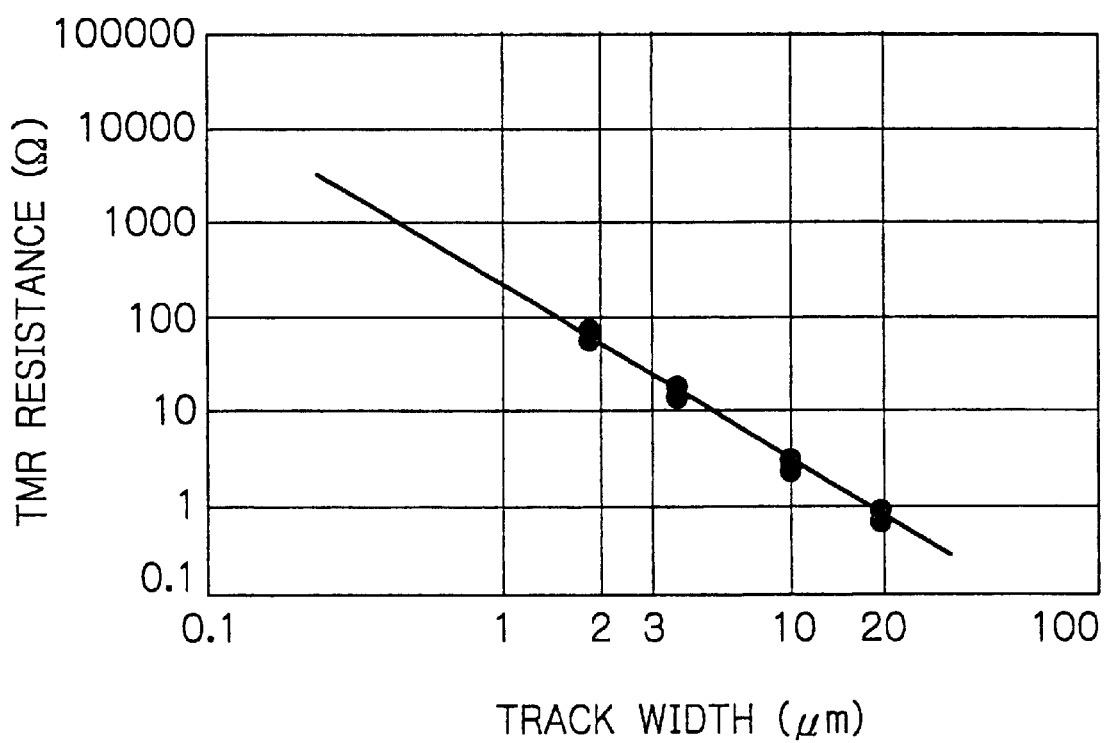
FIG. 7 is a graph showing a relationship between the track width and the resistance of the TMR transducer according to the present invention.

Based on experiments, the inventors found that the resistively of the TMR transducers obtained by the above-described embodiments was very low, i.e., less than approximately $5 \times 10^{-6}$ $\Omega \cdot cm^2$. Therefore, as shown in FIG. 7, which is a relationship between the track width and the resistance of the TMR transducers obtained in the above-embodiments where the tunnel barrier layer is less than 5 nm thick, even when the track width is 2 $\mu$m, the resistance is less than 100 $\Omega$, which shows that a TMR transducers of the above-described embodiments can be placed in practical use for magnetic read heads. Note that, if the track width is 2 $\mu$m, the size of the TMR transducers is 2 $\mu$m×2 $\mu$m.

Figure 8:
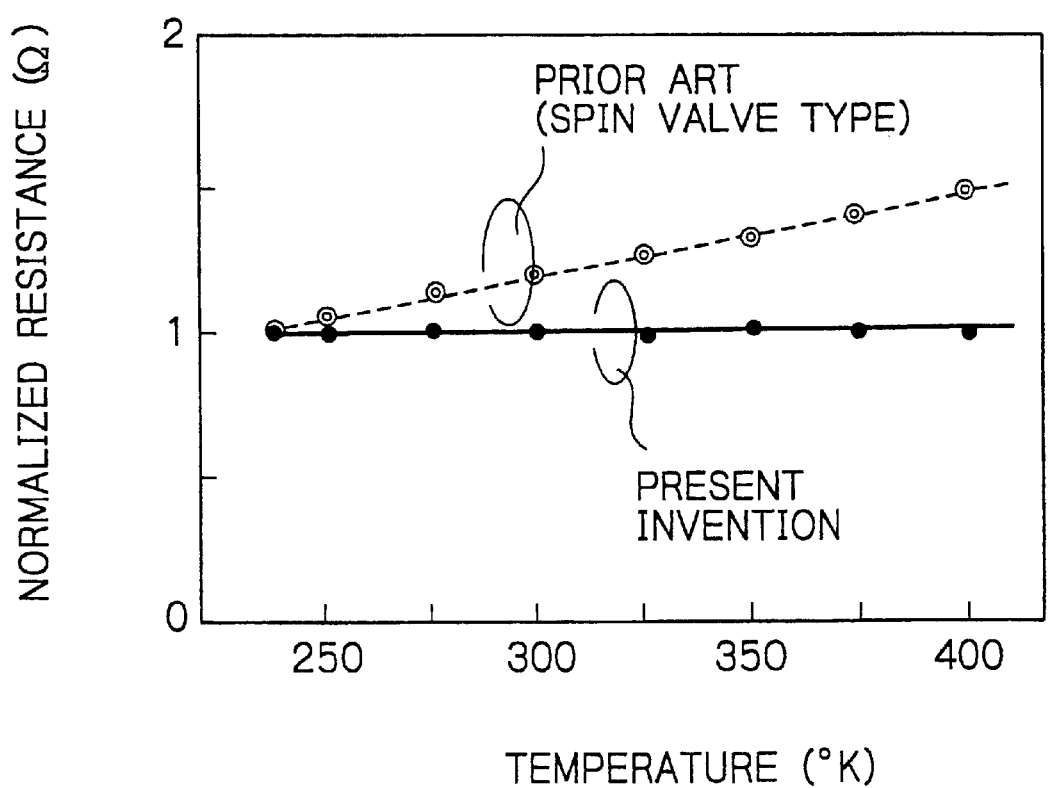
FIG. 8 is a graph showing the temperature and normalized resistance characteristics of the TMR transducer according to the present invention and the prior art spin value type transducer.

Also, the inventors found that the resistance of the TMR transducers according to the present invention remained almost constant regardless of the temperature. In other words, as shown in FIG. 8, the temperature coefficient of the resistance of the TMR transducers according to the present invention was ±0.15%/° C. (±0.04%/° C. in ideal conditions), which shows a small thermal asperity. On the other hand, the temperature coefficient of the resistance of prior art spin valve type transducers was ±0.27%/° C., which shows a large thermal asperity. Note that the temperature coefficient of the conventional MR transducer is ±0.15%/° C. (see: N. Ishiwata et.al., "Narrow Track MR Head Technology", IEEE Trans. on Magnetics, Vol. 32, No. 1, pp. 38–42, January 1996).

The thermal asperity characteristics of the prior art spin valve type transducer and the TMR transducer according to the present invention is explained next with reference to FIGS. 9A and 9B where the flying distance between the transducer and a magnetic recording medium is 20 nm.

As shown in FIG. 9A, which shows the output voltage of a magnetic read head using the prior art spin valve type transducer, once when the magnetic read is in contact with the magnetic recording medium, the resistance of the transducer becomes low to decrease the output voltage. However, immediately thereafter, the transducer is heated by the contact of the transducer with the magnetic recording medium so as to greatly increase the resistance of the transducer, thus greatly increasing the output voltage. Then, the resistance of the transducer also decreases gradually, so that the output voltage of the transducer is gradually decreased. As a result, the base line of pulse-shaped magnetic data detection signals of the output voltage deviates from the zero level, and thus erroneous read operations may be carried out. Consequently, it is impossible to decrease the flying distance between the transducer and the magnetic recording medium. In particular, the prior art spin valve transducer cannot be applied to a magnetic read head for a soft magnetic recording medium.

On the other hand, as shown in FIG. 9B, which shows the output voltage of a magnetic read head using the TMR transducer according to the present invention, even when the magnetic read is in contact with the magnetic recording medium, the resistance of the transducer remains almost constant. In other words, even when the transducer is heated by the contact of the transducer with the magnetic recoding medium, the resistance of the transducer remains almost constant. As a result, the base line of pulse-shaped magnetic data detection signals of the output voltage does not deviate from the zero level, so that erroneous read operations are not be carried out. Thus, it is possible to decrease the flying distance between the transducer and the magnetic recording medium. In particular, the TMR transducer according to the present invention can be applied to a magnetic read head for a soft magnetic recording medium.

Figure 10:
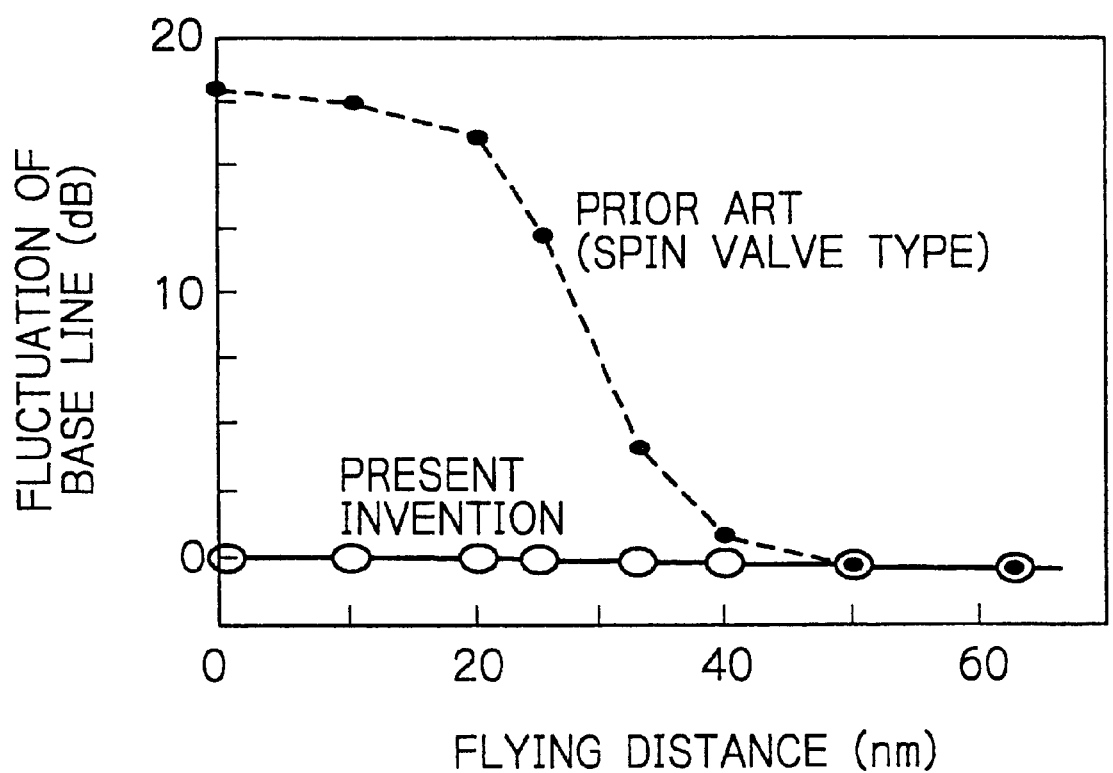
FIG. 10 is a graph showing the base line fluctuation characteristics of the prior art spring valve type transducer and the TMR transducer according to the present invention.

In FIG. 10, which is a graph showing the base line fluctuation characteristics of the prior art spin value type transducer and the TMR transducer according to the present invention, there is prepared a hard disk medium including a NiP plating layer on an Al substrate, a recording layer made of Cr/CoCrPt having a coercive force of 174 kA/m (2200 Oe) on the plating layer and a carbon protection layer on the recording layer. The glide height of the surface of the hard disk medium is 30 nm. In other words, in the prior art spin valve type transducer, when the flying distance the transducer and the recording medium is less than 40 nm, the base line with respect to the zero level fluctuates greatly which shows a large thermal asperity. On the other hand, in the TMR transducer according to the present invention, even when the flying distance the transducer and the recording medium is less than 40 nm, the base line with respect to the zero level hardly fluctuates, which shows a small thermal asperity.

Figure 11:
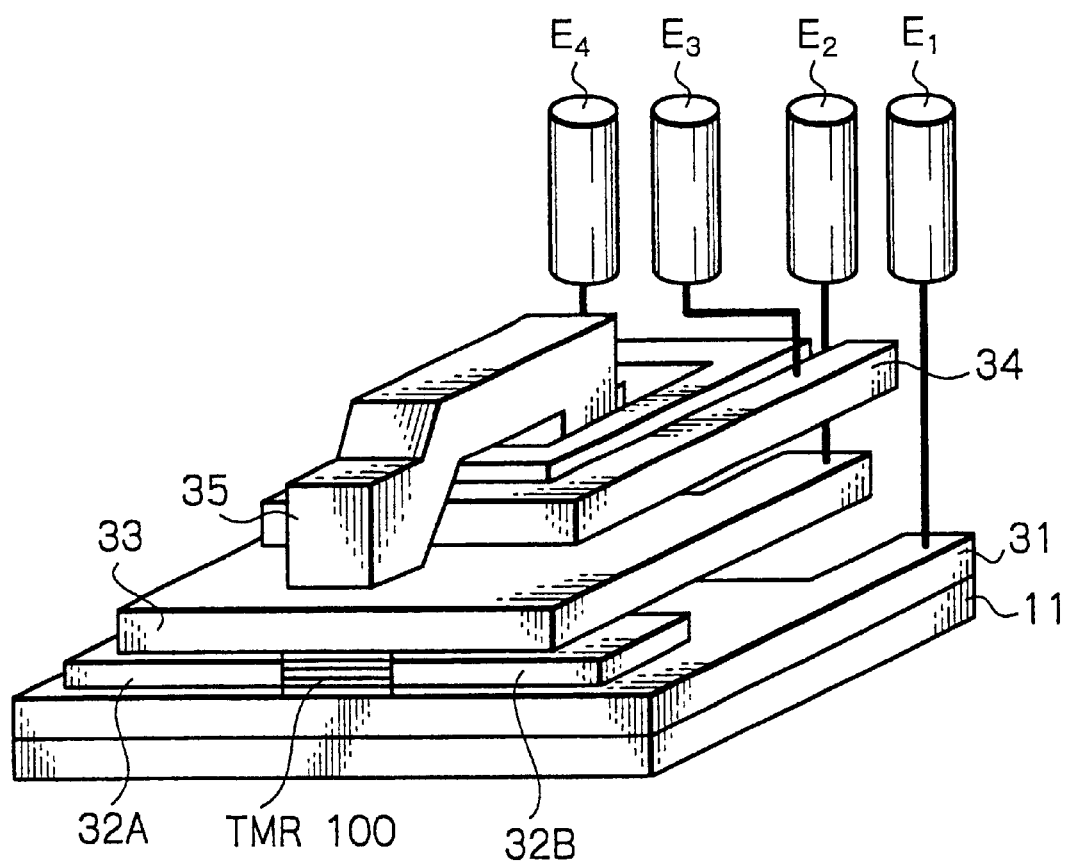
FIGS. 11 and 12 are perspective views of a magnetic write/read head including the TMR transducer according to the present invention.
Figure 12:
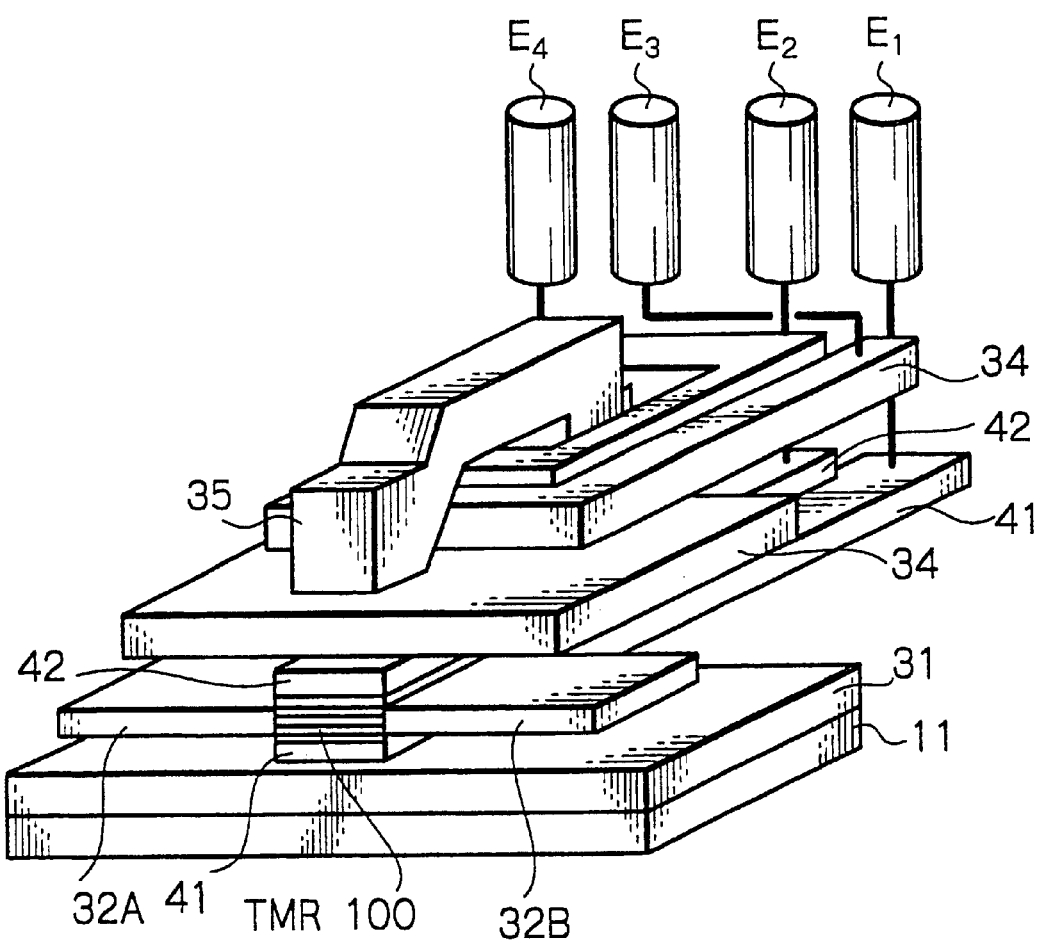

Each of the TMR transducers of the above-described embodiments is introduced into a magnetic write/read head as illustrated in FIG. 11 or 12.

In FIG. 11, a lower magnetic shield layer 31 serving as a magnetic pole is formed between the substrate (slider) 11 and a TMR structure 100 which is constructed by the under layer 12(21), the free layer 12(22), the tunnel barrier layer 15A (15B, 25A, 25B) including the conductive layer 14a, whenever if appropriately, the pinned layer 15(25) and the pinning layer 16(26).

Note that the lower magnetic shield layer (magnetic pole) 31 is omitted from FIGS. 1A, 1B, 1C, 2A, 2B, 2C, 3A, 3B, 3C, 4A, 4B, 4C, 5A through 5E and 6A through 6E, in order to simplify the description.

Also, bias layers 32A and 32B made of ferromagnetic material are provided substantially on the sides of the TMR structure 100 so as to provide magnetic domain control over the free layer 13(23).

Further, an upper magnetic shield layer (magnetic pole) 33 is formed on the TMR structure 100.

Thus, a read head is constructed by the lower magnetic shield layer (magnetic pole) 31, the upper magnetic shield layer 33, and the TMR structure 100 including the bias layers 32A and 32B sandwiched by the lower magnetic shield layer (magnetic pole) 31 and the upper magnetic shield layer (magnetic pole) 33. The lower magnetic shield layer (magnetic pole) 31 and the upper magnetic shield layer (magnetic pole) 33 are connected to read electrode $E_1$ and $E_2$, respectively.

Additionally, a winding layer 34 and a magnetic pole layer 35 are provided so that the winding layer 34 is surrounded by the upper magnetic shield layer 33 and the magnetic pole layer 35.

Thus, a write head is constructed by the upper magnetic shield layer 33, the magnetic pole 35 and the winding layer 34 sandwiched by the upper magnetic shield layer 33 and the magnetic pole layer 35. Two ends of the winding layer 34 are connected to write electrodes $E_3$ and $E_4$, respectively.

In FIG. 12, lower electrode layer (magnetic pole) 41 and an upper electrode layer (magnetic pole) 42 connected to the read electrodes $E_1$ and $E_2$, respectively, are added to the elements of FIG. 11. Therefore, in FIG. 12, the lower magnetic shield layer 31 and the upper magnetic shield layer 34 do not serve as electrodes.

The methods for manufacturing the magnetic write/read head of FIG. 11 is explained next.

First, the lower magnetic shield layer 31 made of about 0.3 to 3 μm thick CoTaZrCr is deposited by a sputtering process on the substrate 11 made of $Al_2O_3$.TiC ceramic. In this case, an annealing operation at 350° C. for one hour is performed upon the lower magnetic shield layer 31 while applying a magnetizing operation using a magnetic field of 39 kA/m (500 Oe) in a horizontal direction of the TMR structure 100 to the lower magnetic shield layer 31.

Next, the TMR structure 100 is formed on the upper magnetic shield layer 31 in a high frequency magnetron sputtering apparatus where the background pressure is $10^{-4}$ Pa ($10^{-7}$ Torr), the Ar pressure is 0.4 Pa (3 m Torr), and the high frequency power is 200W. For example, the underlayer 12(22) is made of about 2 to 200 nm thick Ta, the free layer 15 is made of about 1 to 50 nm thick NiFe, the conductive layer 14(24) is made of about 0.3 to 3 nm thick Al. Also, while the conductive layer 14(24) is being oxidized or nitrided (or the free layer 13 is being oxidized or nitrided), pure oxygen or pure nitrogen at a pressure of 1 to 20 Pa (10 m Torr to 200 m Torr) is introduced into the sputtering apparatus. Note that the oxidation or nitridation of the conductive layer 14(24) is carried out by the introduction of oxygen or nitrogen for 10 minutes.

Then, oxygen or nitrogen is exhausted from the sputtering apparatus, so that the pressure of the sputtering apparatus returns to the background pressure. Then, the pinned layer 16(26) made of about 1 to 50 nm thick CoFe and the pinning layer 17(27) made of about 5 to 200 nm thick PtMn are deposited on the TMR structure in the same sputtering apparatus.

Next, an annealing operation at 230° C. for 3 hours is performed upon the TMR structure 100 while applying a magnetizing operation using a magnetic field of 237 kA/m (3 k Oe) perpendicular to the above-mentioned first direction to the TMR structure 100. Thus, the direction of magnetization of the pinned layer 16(26) becomes perpendicular to the air bearing surface (ABS). Note that since the temperature (230° C.) of the heating operation for the TMR structure 100 is lower than the temperature (350° C.) of the heating operation for the lower magnetic shield layer 31, the lower magnetic shield layer 31 can serve sufficiently as a magnetic shield of an anisotropic magnetic field of 362 A/m (8 Oe).

Next, the TMR structure 100 is patterned by a milling process.

Next, the bias layers 32A and 32B made of about 3 to 300 nm thick are formed on the sides of the TMR structure 100. Note that bias layers 32A and 32B serve as permanent magnets. Note also that the formation of the bias layers 32A and 32B is carried out so that the free layer 13(23) and the pinned layer 16(26) are not short-circuited.

Next, the upper magnetic shield layer 34 made of about 0.3 to 4 μm thick NiFe is formed by a frame plating process. Note that, in order to magnetically isolate the bias layers 32A and 32B from the lower magnetic shield layer 31 and the upper magnetic shield layer 33, non-magnetic material (not shown is introduced between the bias layer 32A and 32B and the magnetic shield layers 31 and 33.

Next, an alumna magnetic gap layer (not shown) and a lower photoresist pattern (not shown) are sequentially formed on the upper magnetic shield layer 34. Then, an annealing operation at 250° C. for 1 hour is performed upon the lower photoresist pattern to harden it.

Next, the winding layer 34 made of Cu and an upper photoresist layer (not shown) are sequentially formed on the lower photoresist pattern. Then, an annealing operation at 250° C. for 1 hour is performed upon the upper photoresist pattern so as to harden it.

Next, the magnetic pole layer 35 made of about 0.5 to 5 μm thick NiFe is formed on the upper photoresist pattern. Then, an annealing operation at 200° C. for 1 hour is performed upon the magnetic pole layer 35 while applying a magnetic field of 79 kA/m (1 kOe) in a magnetization easy axis of the magnetic pole layer 35, thus stabilizing the magnetic anisotropy thereof.

Next, the read electrodes $E_1$ and $E_2$ and the write electrodes $E_3$ and $E_4$ are formed.

Figure 13:
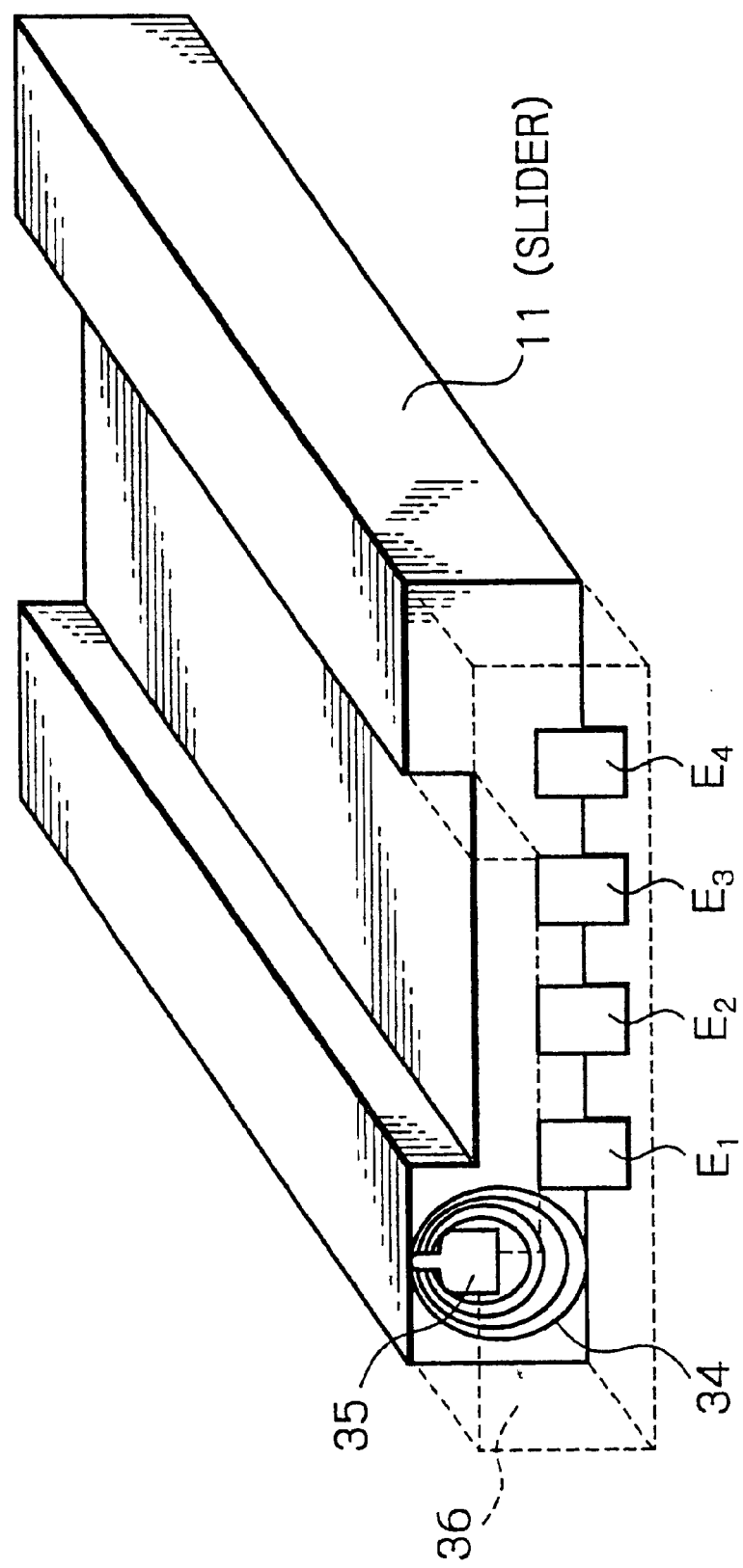
FIG. 13 is a perspective view of the magnetic write/read head of FIGS. 11 and 12 where a protection layer is formed.

Finally, as illustrated in FIG. 13, an alumina protection layer 36 is deposited on the entire surface by a sputtering process. Then, the annealing operation at 250° C. for 1 hour is carried out while applying a magnetic field of 237 kA/m (3 k Oe) perpendicular to the air bearing surface(ABC). As a result, the direction of magnetization of the pinned layer 16(26) substantially coincides with that of the pinning layer 17(27).

The magnetic write/read head of FIG. 13 is cut away from the wafer, and is combined with an arm along with a gimbal spring.

When the manufacturing the magnetic write/read head of FIG. 12, the lower electrode layer 41 made of Ta or the like is formed before formation of the TMR structure, and the upper electrode layer 42 made of Ta or the like is formed after the formation of the TMR structure 100.

Figure 14:
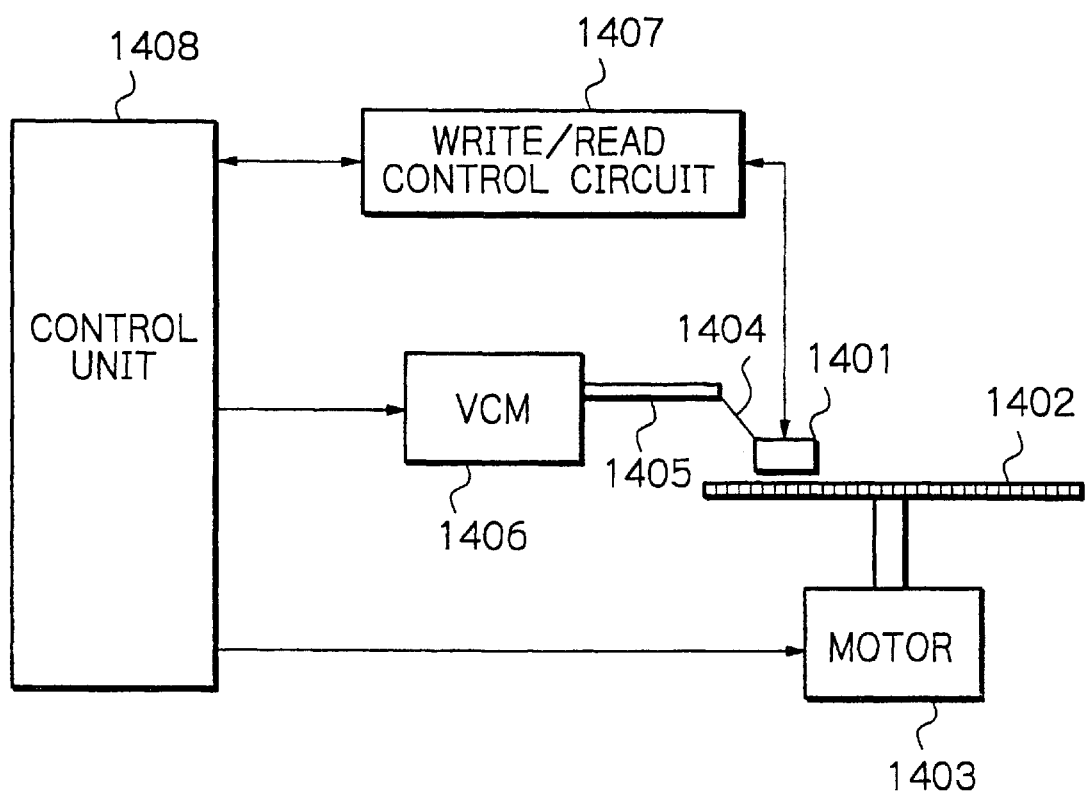
FIG. 14 is a block circuit diagram illustrating a magnetic storage apparatus to which the TMR transducer according to the present invention is applied.

The magnetic write/read head of FIGS. 11(12) is applied to a magnetic storage apparatus as illustrated in FIG. 14. In FIG. 14, a magnetic write/read head 1401 as illustrated in FIGS. 11 and 13 (or FIGS. 12 or 13) faces a magnetic medium 1402 rotated by a motor 1403. The magnetic write/read head 1401 is coupled via a suspension 1404 to an arm 1405 driven by a voice coil motor 1406. Thus, the magnetic write/read head 1401 is tracked by the voice coil motor 1406 to the magnetic medium 1402. The magnetic write/read head 1402 is controlled by a write/read control circuit 1407. Also, the motor 1403, the voice coil motor 1406 and the write/read control circuit 1407 are controlled by a control unit 1408.

Figure 15:
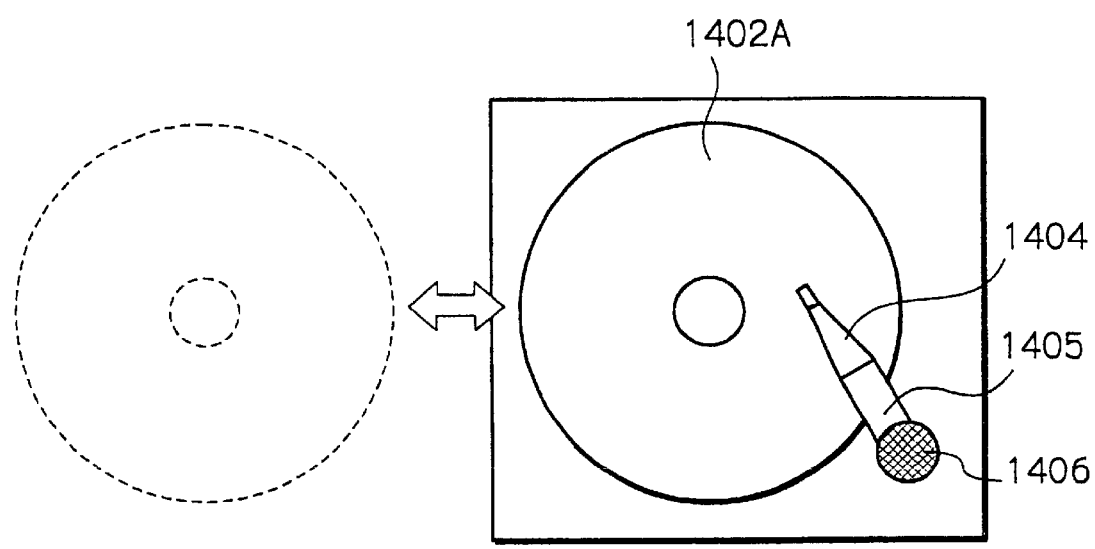
FIG. 15 is a plan view of a soft magnetic disk used in the magnetic storage apparatus of FIG. 14.
Figure 16:
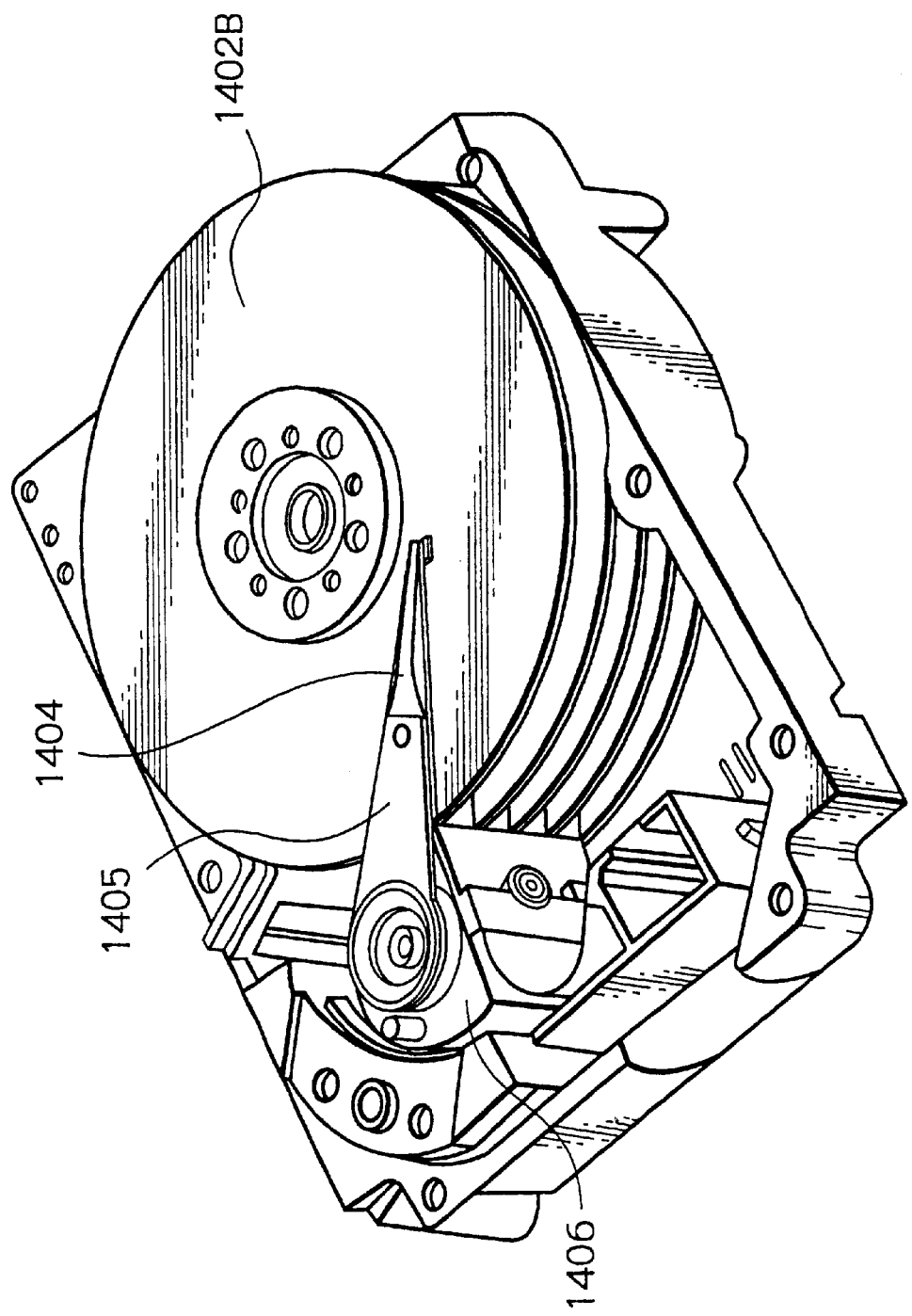
FIG. 16 is a plan view of a hard magnetic disk used in the magnetic storage apparatus of FIG. 14.

The magnetic medium 1402 of FIG. 14 is applied to a soft magnetic disk (floppy disk) 1402A as illustrated in FIG. 15, and a hard magnetic disk 1402B as illustrated in FIG. 16. In FIG. 15, a magnetic medium layer is formed on a circular flexible plastic sheet. In FIG. 16, a magnetic medium layer is formed on a circular glass substrate or a circular aluminum substrate.

In FIGS. 14 and 15 (16), even when the air gap between the magnetic write/read head 1401 and the magnetic medium 1402 was less than 40 nm, no thermal asperity was observed.

Figure 17:
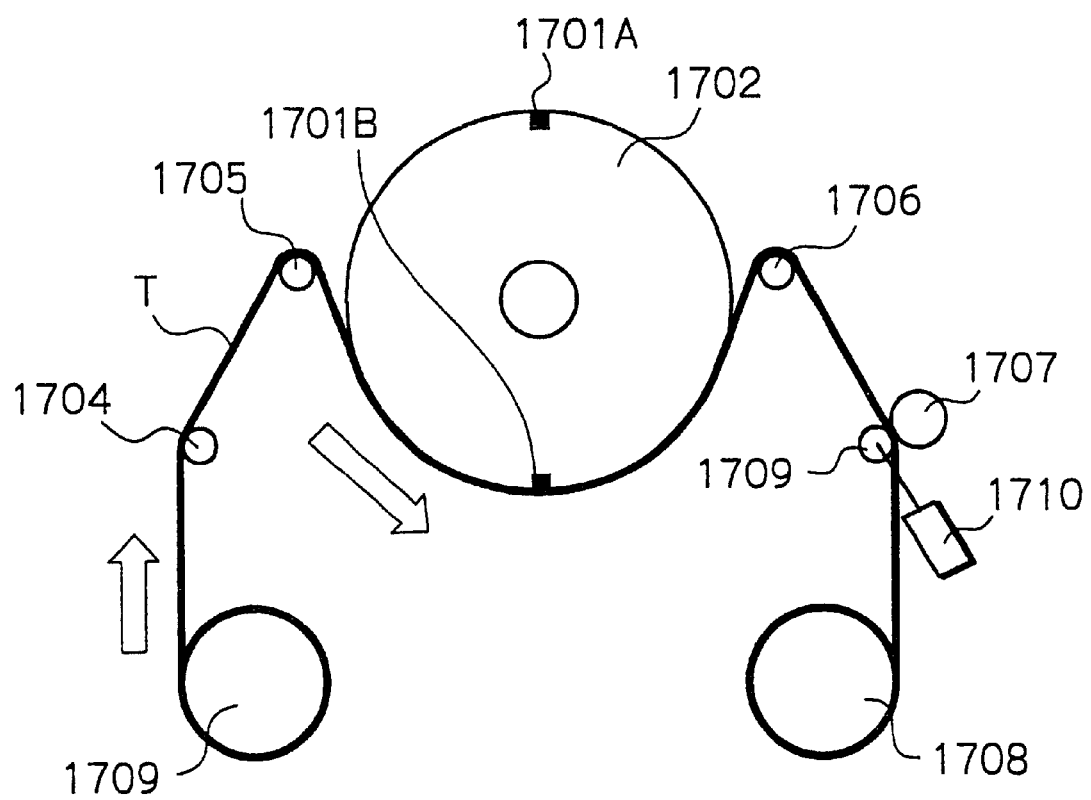
FIG. 17 is a diagram illustrating a magnetic apparatus to which the TMR transducer according to the present invention is applied.

The magnetic write/read head of FIGS. 11(12) and 13 is applied to a magnetic tape apparatus as illustrated in FIG. 17. In FIG. 17, two magnetic write/read heads 1701A and 1701B are mounted on a rotating drum 1702. A magnetic tape T is moved from a reel 1703 via rollers 1704, 1705, 1706 and 1707 to a reel 1708 by a capstan 1709 driven by a motor 1719. In this case, the magnetic tape T is stably in contact with the circumference of the rotating drum 1702, so that the magnetic write/read heads 1701A and 1701B can perform a write/read operation upon the magnetic tape T. Note that an air bearing is introduced between the rotating drum 1702 and the magnetic tape T, an occasion demands. In this case, the air bearing surface ABS is rounded as illustrated in FIG. 18.

Figure 18:
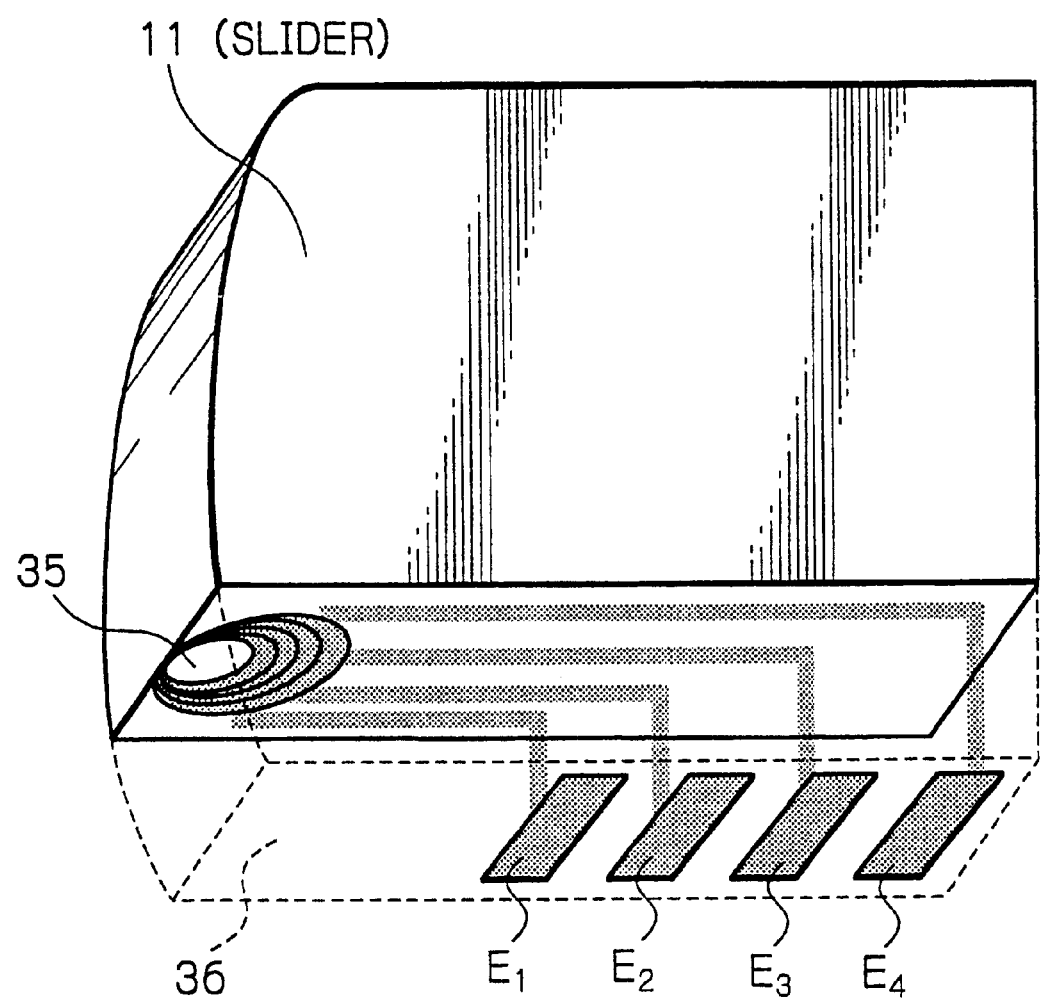
FIG. 18 is a perspective view of the magnetic write/read head of FIG. 17.

In FIGS. 17 and 18, even when the air gap between the magnetic write/read head 1701A(1701B) and the magnetic tape T was less than 40 nm, no thermal asperity was observed.

FIG. 19A is a table showing the experimental results of the stacked structure of ferromagnetic material/natural oxide/ferromagnetic material/antiferromagnetic material according to the present invention. More specifically, when the tunnel barrier layer is less than 5 nm thick, the resistance is $5 \times 10^{-5}$ $\Omega cm^2$ and the temperature coefficient is less than 0.04 %/° C. Also, when the tunnel barrier layer is less than 2 nm thick, the magnetoresistance (MR) ratio is very high.

FIG. 19B is a table showing experimental results in relation to the stacked structure of ferromagnetic material/ natural nitride/ferromagnetic material/antiferromagnetic material according to the present invention. Specifically, when the tunnel barrier layer is less than 5 nm thick, the resistance is $5 \times 10^{-5}$ $\Omega cm^2$ and the temperature coefficient is less than 0.04%/° C. Also, when the tunnel barrier layer is less than 2 nm thick, the magnetoresistance (MR) ratio is very high.

It is preferable that, when growing the natural oxide layer on the natural nitride layer, an ultraviolet irradiation or X-ray irradiation be introduced so as to activate pure oxygen or pure nitrogen on the surface of wafers. More specifically, as illustrated in FIG. 19C, the magnetoresistance (MR) ratio is increased by ultraviolet irradiation-assisted natural oxide. Also, as illustrated in FIG. 9D, the magnetoresistance (MR) ratio is increased by X-rays irradiation assisted natural oxide.

On the other hand, as illustrated in FIG. 19E, the prior art TMR transducer using an oxygen glow discharge process has a high resistance, although the magnetoresistance (MR) ratio is high (see: TMR1 of FIG. 19E). Also, the prior art TMR transducer using an air-exposed oxide has a high resistance (see: TMR2 of FIG. 19E). Further, the prior art GMR transducer and the prior art AMR transducer have high temperature coefficients of resistance.

As explained hereinabove, according to the present invention, the thermal asperity can be suppressed even if the air gap between a TMR transducer and a magnetic medium is less than 40 nm.

What is claimed is:

1. A tunneling magnetoresistance transducer comprising: first and second ferromagnetic layers; and a tunnel barrier layer made of insulating material sandwiched by said first and second ferromagnetic layers, a resistance of said tunnel barrier layer being approximately constant independent of a temperature of said transducer.

2. The transducer as set forth in claim 1, wherein a temperature coefficient of there resistance of said tunnel barrier layer is within 0.15%/° C.

3. The transducer is set forth in claim 1, wherein a temperature coefficient of the resistance of said tunnel barrier layer is within 0.04%/° C.

4. The transducer as set forth in claim 1, wherein the resistance of said tunnel barrier layer is less than about $5 \times 10^{-6}$ $\Omega \cdot cm^2$.

5. The transducer as set forth in claim 1, wherein said tunnel barrier layer is made of oxide which is grown by naturally oxidizing one of metal and amphoteric metal with pure oxygen.

6. The transducer as set forth in claim 1, wherein said tunnel barrier layer is made of oxide which is grown by naturally oxidizing one of Al, Mg and lanthanoid metal with pure oxygen.

7. The transducer of claim 6, wherein the oxide of the tunnel barrier layer is an oxide of a lanthanoid.

8. The transducer as set forth in claim 1, wherein said tunnel barrier layer is made of nitride which is grown by naturally nitriding one of metal and amphoteric metal with pure nitrogen.

9. The transducer as set forth in claim 1, wherein said tunnel barrier layer is made of nitride which is grown by naturally nitriding one of Al, Mg and lanthanoid metal with pure nitrogen.

10. The transducer of claim 9, wherein the nitride of the tunnel barrier layer is an nitride of a lanthanoid.

11. The transducer as set forth in claim 1, further comprising a conductive layer inserted between said first ferromagnetic layer and said tunnel barrier layer.

12. The transducer as set forth in claim 11, wherein said conductive layer is made of one of metal and amphoteric metal.

13. The transducer as set forth in claim 11, wherein said conductive layer is made of one of Al, Mg and lanthanoid metal.

14. The transducer of claim 13, wherein the conductive layer comprises a lanthanoid metal.

15. The transducer as set forth in claim 1, wherein said tunnel barrier layer is less than approximately 5 nm thick.

16. The transducer as set forth in claim 1, wherein said tunnel barrier layer is less than approximately 2 nm thick.

17. A tunneling magnetoresistance transducer comprising:

first and second ferromagnetic layers;

a tunnel barrier layer made of insulating material sandwiched by said first and second ferromagnetic layers, said tunnel barrier layer comprising a nitride of one of Al, Mg and lanthanoid metal; and a conductive layer inserted between said first ferromagnetic layer and said tunnel barrier layer;

wherein said conductive layer comprises a lanthanoid metal.

18. A magnetic storage apparatus including a magnetic write head, a magnetic read head and a magnetic medium, wherein said magnetic read head comprises:

first and second ferromagnetic layers; and a tunnel barrier layer made of insulating material sandwiched by said first and second ferromagnetic layers, a resistance of said tunnel barrier layer being approximately constant independent of a temperature of said transducer.

19. The apparatus as set forth in claim 18, wherein a gap between said magnetic read head and said magnetic medium is less than approximately 40 nm.

20. A magnetic storage apparatus including a magnetic write head, a magnetic read head and a magnetic medium, wherein said magnetic read head comprises:

first and second ferromagnetic layers; and a tunnel barrier layer made of insulating material sandwiched by said first and second ferromagnetic layers;

a resistance of said tunnel barrier layer being less than about $5 \times 10^{-5}$ $\Omega \cdot cm^2$.

21. The apparatus as set forth in claim 20, wherein a gap between said magnetic read head and said magnetic medium is less than approximately 40 nm.

22. A magnetic storage apparatus including a magnetic write head, a magnetic read head and a magnetic medium, wherein said magnetic read head comprises:

first and second ferromagnetic layers; and a tunnel barrier layer made of insulating material sandwiched by said first and second ferromagnetic layers, said tunnel barrier layer comprising an oxide of one of metal and amphoteric metal;

wherein a gap between said magnetic read head and said magnetic medium is less than approximately 40 nm.

23. The apparatus as set forth in claim 22, further comprising a conductive layer inserted between said first ferromagnetic layer and said tunnel barrier layer.

24. The apparatus as set forth in claim 22, wherein said conductive layer is made of one of metal and amphoteric metal.

25. A magnetic storage apparatus including a magnetic write head, a magnetic read head and a magnetic medium, wherein said magnetic read head comprises:

first and second ferromagnetic layers; and a tunnel barrier layer made of insulating material sandwiched by said first and second ferromagnetic layers, said tunnel barrier layer comprising a nitride of one of metal and amphoteric metal;

wherein a gap between said magnetic read head and said magnetic medium is less than approximately 40 nm.

26. The apparatus as set forth in claim 25, further comprising conductive layer inserted between said first ferromagnetic layer and said tunnel barrier layer.

27. The apparatus as set forth in claim 26, wherein said conductive layer is made of one of metal and amphoteric metal.

* * * * *